(12) United States Patent
Matsuda et al.

(10) Patent No.: US 9,730,335 B2
(45) Date of Patent: Aug. 8, 2017

(54) HEAT-BONDING APPARATUS AND METHOD OF MANUFACTURING HEAT-BONDED PRODUCTS

(71) Applicant: Origin Electric Company, Limited, Saitama-shi, Saitama (JP)

(72) Inventors: Jun Matsuda, Saitama (JP); Takayuki Suzuki, Saitama (JP); Masami Kuroda, Saitama (JP)

(73) Assignee: ORIGIN ELECTRIC COMPANY, LIMITED, Saitama (JP)

( * ) Notice: Subject to any disclaimer, the term of this patent is extended or adjusted under 35 U.S.C. 154(b) by 0 days.

(21) Appl. No.: 14/763,135

(22) PCT Filed: Jan. 9, 2014

(86) PCT No.: PCT/JP2014/050240
§ 371 (c)(1),
(2) Date: Jul. 23, 2015

(87) PCT Pub. No.: WO2014/115584
PCT Pub. Date: Jul. 31, 2014

(65) Prior Publication Data
US 2015/0366079 A1 Dec. 17, 2015

(30) Foreign Application Priority Data
Jan. 24, 2013 (JP) .................. 2013-011041

(51) Int. Cl.
*B23K 1/008* (2006.01)
*H05K 3/34* (2006.01)
(Continued)

(52) U.S. Cl.
CPC .......... *H05K 3/3494* (2013.01); *B23K 1/008* (2013.01); *B23K 1/0016* (2013.01); *B23K 3/04* (2013.01);
(Continued)

(58) Field of Classification Search
CPC ........ B23K 1/0016; B23K 1/008; B23K 3/04; B23K 3/047; B23K 3/3494; B23K 2201/42; B23K 2203/085; H05K 3/3494
See application file for complete search history.

(56) References Cited

U.S. PATENT DOCUMENTS 5,031,818 A * 7/1991 Gieskes ................ F27D 1/1858
228/221
5,145,100 A * 9/1992 Kondo ................... B23K 1/008
228/219
(Continued)

FOREIGN PATENT DOCUMENTS

JP    05-211391 A  *  8/1993
JP    H11-233934       8/1999
(Continued)

OTHER PUBLICATIONS

International Search Report dated Mar. 18, 2014, in PCT/JP2014/050240, 2 pages.
(Continued)

*Primary Examiner* — Geoffrey S Evans
(74) *Attorney, Agent, or Firm* — Squire Patton Boggs (US) LLP

(57) ABSTRACT

A heat-bonding apparatus and method of manufacturing a heat-bonded product without overheating during cooling thereof after the completion of the heat-bonding, where the object can be cooled in a shorter time than the conventional when the heat-bonding is performed in a vacuum. A heat-bonding apparatus having a vacuum chamber for housing an object to be heat-bonded and a buffer part, a heater for applying heat to the buffer part placed into contact with the object, an object temperature sensor for detecting a temperature of the object heated through the buffer part, a buffer temperature sensor for detecting a temperature of the buffer part, a vacuum breaker for breaking the vacuum, and a (Continued)

controller for operating the vacuum breaker to break the vacuum when a temperature difference between a temperature detected by the object temperature sensor and a temperature detected by the buffer temperature sensor falls within a range of specified temperature difference.

7 Claims, 7 Drawing Sheets

(51) Int. Cl.
    *B23K 1/00*         (2006.01)
    *B23K 3/04*         (2006.01)
    *B23K 3/047*       (2006.01)
    *B23K 101/42*     (2006.01)

(52) U.S. Cl.
    CPC .......... *B23K 3/047* (2013.01); *B23K 2201/42* (2013.01); *H05K 2203/085* (2013.01)

(56) References Cited

U.S. PATENT DOCUMENTS

| | | | |
|---|---|---|---|
| 2006/0076389 A1* | 4/2006 | Kemper | B23K 1/008 228/103 |
| 2007/0138394 A1* | 6/2007 | Lane | G01J 1/04 250/353 |
| 2008/0185421 A1* | 8/2008 | Diehm | B23K 1/008 228/176 |
| 2010/0121479 A1* | 5/2010 | Ol | G01J 5/0003 700/212 |
| 2015/0321278 A1* | 11/2015 | Matsuda | B23K 1/008 219/85.13 |

FOREIGN PATENT DOCUMENTS

| | | | |
|---|---|---|---|
| JP | 2001-108375 A | * | 4/2001 |
| JP | 2002-280724 A | * | 9/2002 |
| JP | 2005-222964 A | * | 8/2005 |
| JP | 2006082112 (A) | | 3/2006 |
| JP | 2008-068311 A | * | 3/2008 |
| JP | 2010-125486 | | 6/2010 |
| WO | WO 2009/022590 | | 2/2009 |
| WO | WO 2009/090808 | | 7/2009 |
| WO | WO 2013/161875 | | 10/2013 |

OTHER PUBLICATIONS

Chinese Office Action for patent application No. 201480005952.0 mailed Sep. 20, 2016, 7 pages.
Partial translation of Chinese Office Action for patent application No. 201480005952.0 mailed Sep. 20, 2016, 3 pages.
Translation of comments on the 1$^{st}$ OA by Chinese Agent for patent application No. 201480005952.0.

* cited by examiner

HEAT-BONDING APPARATUS AND METHOD OF MANUFACTURING HEAT-BONDED PRODUCTS

TECHNICAL FIELD

The present invention relates to heat-bonding apparatus and method of manufacturing heat-bonded products and, more particularly, to a heat-bonding apparatus and method of manufacturing heat-bonded products that heat and cool a workpiece (a heat-bonded object including an electronic component, substrate, and bonding material) to achieve heat-bonding.

BACKGROUND ART

A soldering apparatus is known in the art as the heat-bonding apparatus in which a heating plate having a heating means is provided in an openable chamber filled with carboxylic acid vapor having a reducing characteristic (see Patent Document 1, for example). Part of the heating plate on which a substrate is placed is flat, and a temperature sensor is provided in the heating plate for sensing the temperature thereof. The heating means is configured to control the temperature of the heating plate based on the sensed temperature of the heating plate.

PRIOR ART DOCUMENT

Patent Document

[PTL 1] Japanese Laid-open Patent Application No. H11-233934 (for example, refer to Claims 1 and 7)

DISCLOSURE OF INVENTION

Problem to be Solved by the Invention

In a conventional heat-bonding apparatus, however, a workpiece placed on the heating plate is overheated in some cases where a vacuum is produced inside the chamber and heat-bonding such as soldering is performed. Specifically, the workpiece can be overheated during the cooling process after the completion of the heat-bonding. The workpiece as the heat-bonded object includes a heat-sensitive element such as a semiconductor device and an electronic component. Thus, the workpiece becomes damaged by heat due to overheating.

The object of the present invention made in view of the problems described above is to provide an excellent heat-bonding apparatus and method of manufacturing a heat-bonded product without overheating during cooling thereof after the completion of the heat-bonding, and can cool the object in a shorter time than the conventional apparatus and method when the heat-bonding is performed in a vacuum.

Means for Solving the Problem

In order to solve the problem described above, a heat-bonding apparatus according to Aspect 1 of the present invention is the heat-bonding apparatus 100 shown in FIG. 1, for example, which comprises: a vacuum chamber 10 for housing an object 1 to be heat-bonded and a buffer part 5; a heater 20 for applying heat to the buffer part 5 placed into contact with the object 1 housed in the vacuum chamber 10; an object temperature sensor 40 for detecting a temperature TD (see FIG. 4A) of the object 1 heated through the buffer part 5; a buffer temperature sensor 60 for detecting a temperature TB (see FIG. 4A) of the buffer part 5; a vacuum breaker 70 for breaking a vacuum B (see FIG. 4A) in the vacuum chamber 10; and a controller 50 for operating the vacuum breaker 70 to break the vacuum B in the vacuum chamber 10 when a temperature difference between a first detected temperature TD of the object temperature sensor 40 and a second detected temperature TB of the buffer temperature sensor 60 falls within a range TO (see FIG. 4A) of specified temperature difference.

The configuration as described above can control to break the vacuum in the vacuum chamber when a temperature difference between the temperature of the object to be heat-bonded and the temperature of the buffer part falls within a range of specified temperature difference. When the vacuum in the vacuum chamber is broken, heat transfer through atmosphere between the object to be heat-bonded and the buffer part is restored. Since the vacuum is broken when the temperature difference between the object and the buffer part falls within a range of specified temperature difference, the object can be protected against thermal destruction caused by abrupt heat transfer from the hot buffer part to the object. In addition, the vacuum in the vacuum chamber can be broken at the earliest possible time in a range in which the object to be heat-bonded is not damaged by heat. The heat transfer (thermal diffusion) from the object to be heat-bonded and the buffer part to atmosphere (convection) can accordingly be restored at the earliest possible time, and the object can be cooled efficiently. Therefore, the above configuration can provide a good heat-bonding apparatus that prevents the object to be heat-bonded from overheating during cooling thereof after the completion of the heat-bonding, and can cool the object in a shorter time compared with the conventional apparatus when the heat-bonding is performed in a vacuum.

A heat-bonding apparatus 100 according to Aspect 2 of the present invention is the heat-bonding apparatus according to Aspect 1, as shown in FIG. 1A, for example, wherein the controller 50 is configured to lower the temperature of the object 1 below a melting point Tm (see FIG. 4A) of a bonding material after breaking the vacuum B (see FIG. 4A) in the vacuum chamber 10.

In the configuration as described above, the temperature of the bonding material can be controlled to be below the melting point after the vacuum in the vacuum chamber is broken. In other words, the controller performs the vacuum break when the temperature of the object is higher than the melting point of the bonding material. At this time, voids in an expanding state which are expanded by the residual pressure therein in a vacuum can be compressed to a shrinking state in which the voids are compressed again under pressure in which the vacuum break is performed, in the joint part in a molten state which is heated to the temperature above the melting point. After the voids in the joint part are compressed to the compressed state, the bonding material is cooled to the solidification temperature below the melting point, and thus the bonding material can be solidified. Therefore, the influence of the voids in the joint part can be limited, and more reliable heat-bonding can be performed.

A heat-bonding apparatus 100 according to Aspect 3 of the present invention is the heat-bonding apparatus according to Aspect 1 or Aspect 2, as shown in FIG. 1A, for example, further comprising: a vacuum pump 80 for discharging air inside the vacuum chamber 10, wherein the controller 50 is configured to control so that the object 1 is prevented from being overheated through adjustment of heat transfer from the buffer part 5 to the object 1 by adjusting air discharge with the vacuum pump 80 and vacuum break with the vacuum breaker 70 in combination.

In the configuration as described above, the rate of the heat transfer (heat transfer coefficient) from the buffer part to the object can be adjusted through the adjustment of the degree of vacuum in the vacuum chamber, and thus the object can be controlled not to be overheated. Therefore, the object can be prevented from being overheated through the temperature control of the object in which the heat transfer from the buffer part to the object is adjusted in accordance with the temperature of the object detected by the object temperature sensor.

A heat-bonding apparatus 100 according to Aspect 4 of the present invention is the heat-bonding apparatus according to Aspect 1 or Aspect 2, as shown in FIG. 1A, for example, further comprising: a vacuum pump 80 for discharging air inside the vacuum chamber 10, wherein the controller 50 is configured to control the temperature difference between the first detected temperature TD (see FIG. 4A) and the second detected temperature TB (see FIG. 4A) to fall within the range of specified temperature difference TO (see FIG. 4A) through adjustment of heat transfer from the buffer part 5 to the object 1 by adjusting air discharge with the vacuum pump 80 and vacuum break with the vacuum breaker 70 in combination.

In the configuration as described above, the rate of the heat transfer (heat transfer coefficient) from the buffer part to the object can be adjusted through the adjustment of the degree of vacuum in the vacuum chamber, and thus the temperature difference between the object and the buffer part can be controlled to fall within the range of specified target temperatures suitable for vacuum break. The vacuum break can be conducted accordingly through the control of the temperature difference between the object and the buffer part at the earliest possible time to fall within the range of specified target temperatures suitable for vacuum break. Therefore, the cycle time required for heat-bonding can be shortened because the object can be cooled through the recovery of natural cooling by atmosphere at the earliest possible time after the vacuum break.

A heat-bonding apparatus 200 according to Aspect 5 of the present invention is the heat-bonding apparatus according to any one of Aspect 1 through Aspect 4, as shown in FIG. 6, for example, wherein the buffer part 5 is provided as a placing table 5b for placing the object 1 thereon, and the heater 20b is provided inside the placing table 5b.

In the configuration as described above, the heater provided inside the placing table can apply heat to the object to be heat-bonded which is placed on the placing table, with equalized temperature distribution through the placing table as the buffer part.

A method of manufacturing a heat-bonded product according to Aspect 6 of the present invention is the method of manufacturing a heat-bonded product, as shown in FIG. 7 (appropriately see FIG. 1A), for example, comprising the steps of: providing the heat-bonding apparatus 100 of any one of Aspects 1 through 5; M1 placing to load the object 1 to be heat-bonded in contact with the buffer part 5 into the heat-bonding apparatus 100; and M2 heat-bonding the object 1 using the heat-bonding apparatus 100.

In this configuration, a heat-bonded product can be manufactured with high productivity because the object to be heat-bonded is prevented from being overheated during cooling of the workpiece after the completion of the heat-bonding and can be cooled in a shorter time compared with the conventional method when the heat-bonding is performed in a vacuum.

A method of manufacturing a heat-bonded product according to Aspect 7 of the present invention is the method of manufacturing a heat-bonded product, as shown in FIG. 7 (appropriately see FIG. 1A and FIGS. 4A,4B), for example, comprising the steps of: M1a placing an object 1 to be heat-bonded and a buffer part 5 under vacuum, the object 1 being arranged into contact with the buffer part 5; M2a heating the buffer part 5 under vacuum; M2c detecting a first temperature TD of the object 1 heated through the buffer part 5; M2e detecting a second temperature TB of the buffer part 5;

M2f breaking the vacuum B when a temperature difference between the first temperature TD detected by the first temperature detecting step and the second temperature TB detected by the second temperature detecting step falls within a range of specified temperature difference TO.

In this configuration, a heat-bonded product can be manufactured with high productivity because the object to be heat-bonded is prevented from being overheated during cooling of the workpiece after the completion of the heat-bonding and can be cooled in a shorter time compared with the conventional method when the heat-bonding is performed in a vacuum.

Effect of the Invention

According to the heat-bonding apparatus and method of manufacturing a heat-bonded product of the present invention, a good heat-bonding apparatus and method of manufacturing a heat-bonded product can be provided that prevents the object to be heat-bonded from overheating during cooling thereof after the completion of the heat-bonding, and can cool the object in a shorter time compared with the conventional apparatus and method when the heat-bonding is performed in a vacuum.

BEST MODE FOR CARRYING OUT THE INVENTION

Figure 1A:
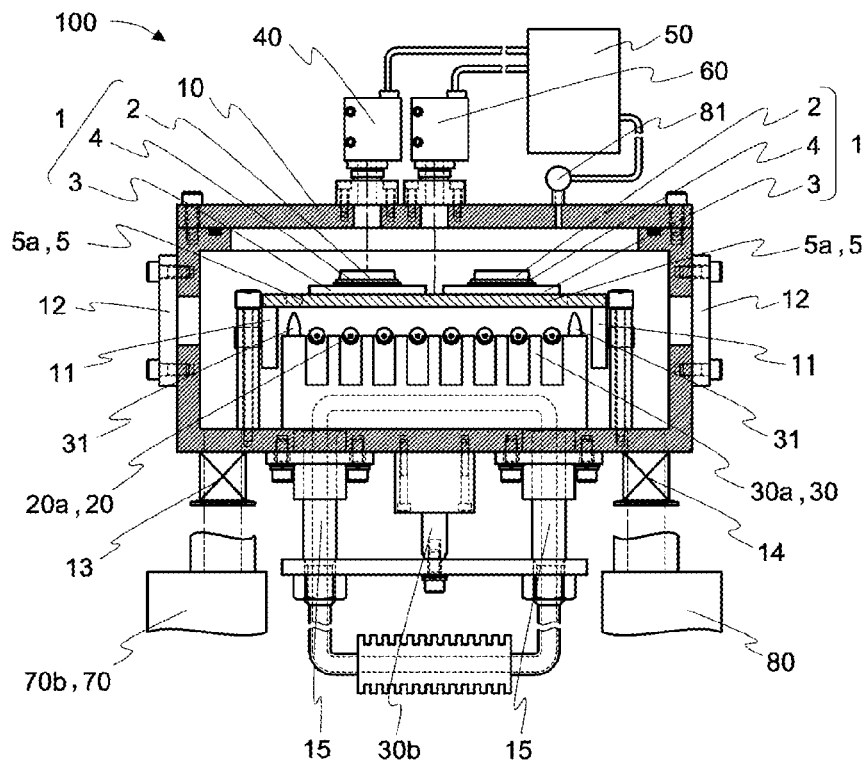
FIG. 1A is a front cross-sectional view showing an example of a soldering apparatus as the heat-bonding apparatus according to a first embodiment of the present invention, which shows a state where the cooling block is spaced apart from the buffer part and the buffer part is heated with thermal radiation heater.

This application is based on the Patent Application No. 2013-011041 filed on Jan. 24, 2013 in Japan, the contents of which are hereby incorporated in its entirety by reference into the present application, as part thereof.

The present invention will become more fully understood from the detailed description given hereinbelow. The other applicable fields will become apparent with reference to the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

With reference to the drawings, some embodiments of the present invention will be described hereinafter. In each drawing, the members identical with or corresponding to each other are given with the same or similar reference numerals, and the redundant description may not be repeated.

In the embodiment of the invention of the present application, the term "heat-bonding" broadly refers to bonding of workpieces by heating and cooling a bonding material and typically to bonding of workpieces by heating/melting and cooling/solidifying the bonding material. The heat-bonding includes brazing and soldering with metal bonding materials and bonding and welding with resin bonding materials or glass bonding materials. In the following embodiment as an example of the heat-bonding apparatus, a soldering apparatus in which a solder that is called as soft brazing alloy in brazing is used as the bonding material for soldering is described.

Figure 1B:
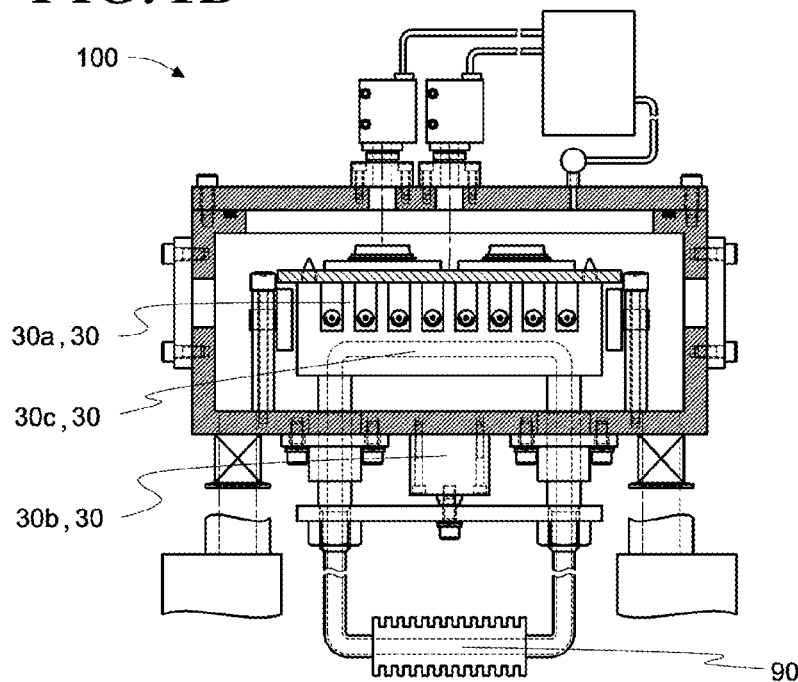
FIG. 1B is a front cross-sectional view showing the first embodiment of the present invention, which shows a state where the cooling block is brought into contact with the buffer part and the heat of the buffer part is discharged with the cooling block.

Referring to FIG. 1, a soldering apparatus 100 as the heat-bonding apparatus according to a first embodiment of the present invention is described. The explanation is made mainly referring to FIG. 1A showing a heating state by the exemplary soldering apparatus 100 and appropriately to FIG. 1B showing a heat discharging state (cooling state) as well. Also, the plots in FIG. 4 showing operating conditions of the soldering apparatus 100 for the description on the temperature control and pressure reducing control of the soldering apparatus 100 are referred to. The soldering apparatus 100 is a vacuum soldering apparatus provided with a vacuum chamber 10 in which the pressure in the space housing the object to be soldered (workpiece) 1 is reduced to a vacuum and the object 1 is soldered in the vacuum. During soldering in the vacuum, the formation of an oxide film on the surface of solder can be prevented. Thus, highly reliable soldering can be achieved with a higher bonding strength and an excellent electrical conductivity and without blocking of soldering due to the oxide film.

In addition, in case of soldering under vacuum, any flux is not required to be added to solder as a reducing agent for preventing the formation of the oxide film. Further, a flux removing process, following the soldering process, for cleaning and removing the flux that remains on the object 1 and having a possibility of inhibiting electrical conductivity can be eliminated. Additionally, the soldering apparatus 100 for soldering in the vacuum does not require to fill the vacuum chamber 10 with a reducing gas, unlike conventional soldering apparatus in which soldering is conducted in an atmosphere of the reducing gas such as hydrogen gas or formic acid gas (see Claim 1 of Patent Document 1, for example). Above all, the soldering can be conducted without using the combustible hydrogen gas, the reducing gas, that requires careful handling. Accordingly, the soldering apparatus 100 has an advantage of being able to effectively and easily perform the reliable soldering.

FIG. 1A and FIG. 1B are front cross-sectional views as seen from a conveying direction of a conveyor line for the objects 1 to be soldered, which are directed from the back side of the drawing sheet toward the front side thereof. Walls of the vacuum chamber 10 are cut at the position where heat detection parts of an object temperature sensor 40 and a buffer temperature sensor 60 are disposed, and the cross section of the walls is shown in the drawing. An exhaust outlet 14 of the vacuum chamber 10 is connected to a vacuum pump 80 for discharging air inside the vacuum chamber 10 (hereinafter, appropriately referred to as the "chamber interior"). The vacuum pump 80 can discharge air in the chamber interior to the outside of the vacuum chamber 10 to arbitrarily reduce the pressure of the chamber interior to a vacuum (pressure lower than atmospheric pressure) or a high vacuum. The vacuum pump 80 can produce a medium vacuum of about 7 to 133 Pa (about 50 to 1000 mTorr) in the chamber interior. The pressure in the chamber interior can be detected with a pressure gage 81 that is disposed so as to have a pressure detecting section in the chamber interior. The value of the pressure in the chamber interior is transmitted to a controller 50 (see FIG. 3) for centrally controlling the operation of the soldering apparatus 100 described later and used for adjusting actuation of the vacuum pump 80. The exhaust outlet 14 is disposed to be openable and closable in accordance with control commands from the controller 50 and operated to be opened during the actuation of the vacuum pump 80 and closed for the periods other than the actuation period.

Gate valves 70a (see FIG. 2) as vacuum breakers 70 described later are disposed in a pair of the walls that transverses the conveyor line of the objects 1 among a plurality of walls provided in the vacuum chamber 10. Each gate valve 70a is disposed to be openable and closable in order to transfer the objects 1 into the chamber interior along the conveyor line and to transfer the objects 1 out of the chamber interior. The gate valve 70a is actuated by an air cylinder (not shown) connected thereto and slidingly opened and closed in the direction vertical to the horizontal direction. The gate valve 70a is also disposed to close the chamber interior air-tightly so as to be able to reduce the pressure of the chamber interior to the vacuum when the gate valve 70a is closed. The gate valve 70a is operated and regulated by the controller 50 (see FIG. 3) as described later. Thus, the controller 50 can operate and regulate to arbitrarily select sealing (closing) of the vacuum chamber 10 and vacuum break (pressure recovery) of the vacuum inside the chamber.

The wall of the vacuum chamber 10 for separating the chamber interior from the outside atmosphere is made of stainless steel with relatively high thermal insulation properties. Thus, the chamber interior in which the object 1 is subjected to heat treatment can be thermally insulated from the outside atmosphere, and the object 1 can be soldered efficiently therein. The plurality of partition walls in the vacuum chamber 10 are provided with transparent view windows 12 of heat-resistant glass. Consequently, the operating condition of the apparatus and the soldering condition of the object 1 can be visually monitored even in operation of the soldering apparatus 100.

The object 1 to be soldered is placed on a placing carriage table 5a as a placing table 5. The placing carriage table 5a is disposed as a flat plate made of metal. The placing carriage table 5a on which the object 1 is put is placed on a plurality of conveying rollers 11 provided in the soldering apparatus 100. The plurality of conveying rollers 11 form the conveyor line for the object 1 in the soldering apparatus 100. The placing carriage table 5a is made of copper that has a high thermal conductivity. In this case, the object 1 can efficiently be heated or cooled for heat treatment thereof through the placing carriage table 5a as described later. The placing carriage table 5a may be made of any other metals such as a copper alloy as long as they have a high thermal conductivity. In this embodiment, the plural (2 columns and 3 rows, 6 in total, for example (see the side view shown in FIG. 2 as well)) objects 1 to be soldered are arranged on the placing carriage table 5a. In such case, the plural objects 1 can simultaneously be subjected to heat treatment and efficiently soldered. The plurality of conveying rollers 11 that form the conveyor line in the soldering apparatus 100 feed the object 1 to a soldering position (heating/cooling position) shown in the drawing by placing the placing carriage table 5a thereon and rotating to load the object into the soldering apparatus 100.

The object 1 to be soldered typically includes an electronic component 2 and a substrate 3. The object 1 is typically soldered such that solder such as film solder (or cream solder is also applicable) is placed on the substrate 3, then the electronic component 2 is placed on the film solder, and the object 1 is heated and cooled in this condition. In soldering by the soldering apparatus 100, the solder is heated to the temperature higher than the solder melting temperature (melting point) $T_m$ (see FIG. 4A) (300 degrees Celsius, for example) in the vacuum, and then the melted solder is cooled and becomes solidified again, and thus the electronic component 2 and the substrate 3 are joined (soldered) to each other at a solder joint part 4. The electronic component 2 generally refers to electronic components including a semiconductor package and surface-mounted chip resistor and chip capacitor, which are fixed on/brought into electric continuity with the substrate 3 by soldering.

The soldering apparatus 100 according to this embodiment includes a plurality of thermal radiation heaters 20a as a heater 20. The thermal radiation heater 20a is disposed in a straight line and has a circular cross section (cylindrical rod shape) (see also the side view shown in FIG. 2). In this embodiment, the thermal radiation heater 20a is disposed to not heat directly the object 1 to be soldered but to heat the placing carriage table 5a that is the placing table 5 as a buffer part. The buffer part serves as a thermal buffer part when the object 1 is heated by the thermal radiation heater 20a. The buffer part typically has higher heat capacity than that of the object to be soldered and interposes between the heater and the object. On the other hand, since the buffer part has higher heat capacity, residual heat may be applied to the object even after the heater stops heating. In this embodiment, a cooler 30 is provided to prevent redundant heating. Thus, the buffer part can protect the heat-sensitive object to be soldered from thermal destruction due to overheating.

The buffer part can also equalize the heating by the heater in terms of time and space and transfer the heat to the object. Thus, the object can be prevented from being thermally deformed (thermally bent) due to unequal heating when the heat is applied through the buffer part. The thermal deformation of the object can be prevented by heating the object through the buffer part that is arranged to come into contact with the object. That is to say, a good contact state between the object and the buffer part can be maintained.

A halogen heater is provided as the thermal radiation heater 20a. The thermal radiation heater 20a is provided such that a thermal radiation part including a thermal radiation filament made of tungsten is covered with a thermal radiation part sealing tube made of silica glass. The thermal radiation part sealing tube encapsulates an inert gas (such as nitrogen or argon gas) and a halogen gas (such as iodine or bromine gas). When the halogen heater is provided as the thermal radiation heater 20a, the thermal radiation heater 20a can withstand abrupt temperature rise/drop because of a halogen cycle between the halogen and the tungsten. Thus, the temperature of the tungsten filament (thermal radiation part) can be raised at a high temperature exceeding 2700 degrees Celsius in a few seconds after energization. Accordingly, the thermal radiation heater 20a can rapidly heat the placing carriage table 5a facing thereto by heat radiation from the thermal radiation part that becomes a high temperature. In addition, the thermal radiation heater 20a can keep the lifetime of the tungsten filament long enough because of the halogen cycle. Thus, the placing carriage table 5 can be heated rapidly, and the thermal radiation heater 20a that has a high economical productivity and good characteristics can be realized.

The heating in a vacuum through heat radiation from the thermal radiation heater 20a is not blocked by the vacuum. Thus, the thermal radiation heater 20a can efficiently apply heat to the placing carriage table 5a from a heating position set apart from the placing carriage table 5a. The heat radiation from the thermal radiation heater 20a, the halogen heater, includes infrared radiation having a wide wavelength range from a near-infrared wavelength range (approx. 0.75-approx. 4 μm) to a far-infrared wavelength range (approx. 4 μm-approx. 1 mm) The placing carriage table 5a is heated by the heat radiation from the thermal radiation heater 20a, and the object 1 placed on the placing carriage table 5a is indirectly heated by the heat transferred from the placing carriage table 5a.

When the temperature of the heated object 1 reaches a specified control target temperature $T_{T2}$ (see FIG. 4A), heating the object 1 is achieved. The specified control target temperature $T_{T2}$ is set to be a slightly higher (for example, higher by 25 degrees Celsius) than the solder melting temperature (melting point) $T_m$ (see FIG. 4A) in order to ensure good soldering. The thermal radiation heater 20a can heat the solder joint part 4 of the object 1 to, for example, 220-400 degrees Celsius in accordance with the solder melting temperature (melting point) $T_m$, within the range of heating temperature in which the object 1 is not brought to thermal destruction. In the exemplary soldering apparatus 100, the heating temperature of the solder joint part 4 (control target temperature $T_{T2}$ of electronic component 2) can be set to 325 degrees Celsius, for example, in order to solder the solder joint part 4 using the solder that contains a higher content of lead component. The details on the control of heating the placing carriage table 5a by the thermal radiation heater 20a are described later.

The soldering apparatus 100 is provided with the cooler 30 for cooling the placing carriage table 5a that has been heated with the thermal radiation heater 20a described above. The thermal radiation heater 20a and the cooler 30 according to this embodiment are disposed within the same vacuum chamber 10. According to the arrangement described above, the objects 1 placed at the same loading positions within the same vacuum chamber 10 can be subjected to heat treatment through successive heating and cooling without transferring the object 1 (and the placing carriage table 5a). In this case, the processing time required for the soldering as the heat-bonding of the object 1 can be reduced significantly.

The cooler 30 has a cooling block 30a and an air cylinder 30b as a drive unit for driving the cooling block 30a. The cooling block 30a is supported by a plurality of guide posts 15 and driven by the air cylinder 30b so as to move close to or away from the placing carriage table 5a. A coolant circulating circuit 30c (see FIG. 1B) is provided inside the cooling block 30a for circulating cooling water as the coolant that cools the cooling block 30a. When water is used as the coolant, water can easily be used or disposed of as compared with the case where another coolant is used. The cooling water circulating in the coolant circulating circuit 30c is supplied by a coolant supplying unit 90 (see FIG. 1B) having a feed pump. The heat drawn from the cooling block 30a by the cooling water circulating in the coolant circulating circuit 30c is dissipated into the atmosphere from radiator plates provided in the coolant supplying unit 90. The coolant for cooling the cooling block 30a may be any cooling liquids or gases as well as the cooling water. For example, a refrigerant that cools through latent heat of vaporization may be used in a direct manner. In addition, the cooling water may be circulated in the coolant circulating circuit 30c just once and disposed of after one circulation without being circulated in the coolant circulating circuit 30c repeatedly. In this case, the soldering apparatus 100 can be provided more easily. The adjustment for cooling the cooler 30 by means of the coolant supplying unit 90 is described later in detail.

The cooling block 30a may be made of copper that has a high thermal conductivity. In this case, the heat of the placing carriage table 5a can efficiently be discharged with the cooling block 30a. The cooling block 30a may be made of any other metals, such as the copper alloy, having a high thermal conductivity. The cooling block 30a may be provided such that copper plates as cooling plates are inserted (fitted) into fitting grooves (not shown) formed in a base part of the cooling block 30a or that a plurality of cooling plates and a cooling base is shaped from a solid copper block through deep grooving by a milling machine.

The cooling block 30a is typically disposed adjacent to the thermal radiation heater 20a. When the cooling block 30a is disposed as described above, the cooling block 30a comes into contact with the vicinity of a heat applying part of the placing carriage table 5a heated by the thermal radiation heater 20a, and thus the heat of the placing carriage table 5a can efficiently be discharged with the cooling block 30a. In addition, guide pins 31 are provided at both ends of the cooling block 30a. In the case where the guide pins 31 are provided as described above, the placing carriage table 5a can be moved and positioned with the guide pins 31 fitted into corresponding positioning holes formed in the placing carriage table 5a when the cooling block 30a is driven. Thus, the cooling plate of the cooling block 30a and the placing carriage table 5a can be positioned relative to each other. Because the cooling plate can correctly be positioned with respect to the heat applying part of the placing carriage table 5a and come into contact with a specified cooling region of the placing carriage table 5a accordingly, the heat of the placing carriage table 5a can efficiently be discharged. When the positioning is conducted as described above using the guide pins 31, the placing carriage table 5a and the object 1 can be prevented from deviating from specified arrangement positions due to the abutment of the cooling block 30a against the placing carriage table 5a. Thus, an object temperature sensor 40 and a buffer temperature sensor 60 included in the soldering apparatus 100 described below can accurately detect the temperatures of the object 1 to be soldered and the placing carriage table 5a which are correctly arranged in the specified positions.

The cooling block 30a is formed in a comb shape so that each of the thermal radiation heaters 20a can be disposed between two comb teeth. Each comb tooth of the cooling block 30a is formed in the shape of a flat plate. The comb has a specified thickness and arranged such that the thickness direction is oriented in the horizontal direction. In other words, the front side and the back side are arranged in the horizontal direction. One end face of the flat plate which is normal to the front side and the back side is arranged in the horizontal direction and forms an upper end face (contact face) of the cooling block 30a. The lower end (face) opposite to the upper end face is integrally connected to the base of the cooling block 30a in which the coolant circulating circuit 30c (see FIG. 1B) is provided. The specified thickness is determined in accordance with the size of the object 1 to be soldered. An appropriate thickness of a comb tooth is 0.2-0.6 times, preferably 0.3-0.5 times, of the arrangement interval with which a plurality of the thermal radiation heaters 20a are arranged.

Temperature of the objects 1 is indirectly regulated by the cooling block 30a through the placing carriage table 5a as is the case with heating by the thermal radiation heater 20a. In this case, the temperature of the objects 1 is regulated by the cooling block 30a through temperature equalization with the placing carriage table 5a in terms of time and space. When the temperature of the objects 1 is regulated through the placing carriage table 5a as described above, the temperature of the objects 1 can be uniformly regulated, unlike the case where the placing carriage table 5a as the buffer part is not provided.

The cooling block 30a discharges the heat from the placing carriage table 5a through heat transfer when abutting against (coming into contact with) the placing carriage table 5a. A drive unit 30b for driving the cooling block 30a adjusts the approach and the separation of the cooling block 30a to and from the placing carriage table 5a. The drive unit 30b is driven in accordance with control commands from a buffer temperature adjusting part 55c-1 (see FIG. 3B) included in the controller 50 described later in detail. Thus, the controller 50 can adjusts the approach and the separation of the cooling block 30a to and from the placing carriage table 5b heated by the thermal radiation heater 20a. In other words, the controller can adjusts the approach and the separation of the cooling block to and from the buffer part heated by the heater. The term "to adjust the approach and the separation" herein refers to a concept including "to make contact by approaching and to keep a distance by moving away" and "to adjust a distance between the buffer part and the cooling block". The cooling block is typically driven to move to either one of two positions which are a contact position where the cooling block comes into contact with the buffer part and a spaced position where the cooling block is spaced apart from the buffer part, and adjusts the time for which the cooling block is kept at the contact position and the spaced position. Thus, the cooling block can control the temperature of the object to be soldered as described later.

The cooling block 30a is put on standby at the spaced position (see FIG. 1A) apart from the placing carriage table 5a when the thermal radiation heater 20a applies heat to the object 1 by heating the placing carriage table 5a. On the other hand, the cooling block is driven to move in the vertical direction toward a lower face of the placing carriage table 5a to the contact position (see FIG. 1B) in contact with the placing carriage table 5a in accordance with the commands from the controller 50 described below in detail when the object 1 is to be cooled through the placing carriage table 5a. The thermal radiation heater 20a and the cooling block 30a are both provided so as to face and adjacent to the object 1 and the placing carriage table 5a; however, those are provided such that respective distances from the heater 20a and the cooling block 30a to the object 1 and the placing carriage table 5a can be independently different from each other. That is to say, the thermal radiation heater 20a and the cooling block 30a are provided so as to be capable of relative movement, and those are not fixed as one unit. In addition, an upper face of the cooling block 30a is formed in the comb shape as described above, and thus the cooling block 30a does not interfere with the plurality of the thermal radiation heaters 20a when the cooling block 30a is driven by the drive unit 30b to move toward the placing carriage table 5a. The comb teeth of the cooling block 30a protrude from between the plurality of the thermal radiation heaters 20a to come into contact with the placing carriage table 5a (see FIG. 1B).

In the case that the cooling block is provided as described above, the height of the cooling block 30a (the length of a comb tooth part) is set to a specified height, and thus the placing carriage table 5a and the thermal radiation heater 20a can be spaced each other at a specified distance. The thermal radiation heater 20a is fixedly installed and arranged as described above so as to be spaced at the specified distance from and heat the placing carriage table 5a (see FIG. 1A). The separation distance for heating is set so that the heat radiation from the thermal radiation heater 20a can moderately be diffused to uniformly cover and heat the entire lower face of the placing carriage table 5a. Thus, the object 1 can be heated most efficiently at the heating position (separation distance). On the other hand, the placing carriage table 5a is arranged so as to be moved from the heating position (optimum separation distance from the thermal radiation heater 20a) by the cooling block 30a when cooled.

As shown in FIG. 1B, the placing carriage table 5a is moved away from the thermal radiation heater 20a, for example. In addition, the thermal radiation heater 20a is positioned at a base part of the comb tooth of the cooling block 30a, and the heat radiation is blocked from diffusing, by the comb tooth. The thermal radiation heater 20a has a tendency to continue to heat the placing carriage table 5a with residual heat even after electrical heating is stopped, as described later in detail. In this case, the comb tooth of the cooling block 30a allows the placing carriage table 5a to move from the optimum heating spacing and can reduce the diffusion of the heat radiation from the thermal radiation heater 20a to a minimum. Thus, the heating efficiency of the placing carriage table 5a by the thermal radiation heater 20a can be reduced, and the cooling efficiency of the placing carriage table 5a and the object 1 can be enhanced.

In the soldering apparatus 100, the cooling block 30a lifts up the placing carriage table 5a from the conveying roller 11 entirely as shown in FIG. 1B when the cooling block 30a most closely comes into contact with the placing carriage table 5a. At that time, the most intimate contact state between the cooling block 30a and the placing carriage table 5a is attained by means of the weight of the object 1 and the placing carriage table 5a, that is, the contact position where the cooling block comes into contact with the buffer part. The details on the control of heat discharge (cooling) from the placing carriage table 5a by the cooling block 30a are described later.

The vacuum soldering apparatus for soldering in a vacuum blocking the heat transfer has particular technical problems. The inventors of the present application found that the following phenomena are main causes of overheating of the object to be soldered. (1) Natural cooling of the object (heat transfer to atmosphere by convection from the object) cannot be expected in the vacuum. (2) Once the buffer part such as the placing table in contact with the object is heated, the object is continuously heated by the heat transfer or heat radiation of accumulated heat even after the heater is turned off (3) A vacuum is interposed at least partially between the buffer part and the object, and the heat transfer is blocked due to the vacuum. In the vacuum, a decrease in (blockage of) the heat transfer due to the vacuum causes difference in heating state between the buffer part and the object. Thus, the buffer is kept at an excessively high temperature in some cases even after the object is heated to a target temperature to be soldered. This phenomenon is particularly noticeable when the heating is required in a hurry in order for the cycle time to be shortened. The heat is finally transferred to the object through heat transfer due to heat radiation between the buffer part and the object and heat conduction through a contact part between the buffer part and the object. Due to such heat transfer, the temperature of the object may overshoot (the object may be overheated) from the target temperature appropriate to the soldering.

In addition, the inventors of the present application found that the object may be overheated, when the vacuum in the vacuum chamber is broken, due to quick recovery of heat transfer through atmosphere between the object to be soldered and the buffer part such as the placing table which is brought into contact with the object. This problem arises from a large temperature difference between the object and the buffer part due to the buffer part being heated in a state where the heat transfer between the object and the buffer part is reduced in a vacuum. Then, the heat transfer through atmosphere is regained due to the vacuum break in the state where the object and the buffer part have the temperature difference. The object is rapidly heated by the hot buffer part thereafter. The object becomes overheated through this heating. As described above, the heat accumulated in the buffer part heated to a high temperature in a thermally insulated state by the vacuum rapidly flows into the object due to the vacuum break and causes overheating of the object. It has been obscure in a conventional art that the overheating of the object is caused by the large temperature difference between the buffer part and the object during the soldering in a vacuum as described above.

On the other hand, the vacuum break contributes to the recovery of heat dissipation (thermal diffusion) to the atmosphere such as ambient air circulating by convection from the heated object and buffer part and the cooling of the object. Thus, in the case that the vacuum break is conducted in the earliest possible stage within the condition ranges where the object is not overheated due to the vacuum break described above, the object can be prevented from overheating and cooled in a less time. The soldering apparatus according to the invention of the present application is configured based on important findings in the vacuum soldering apparatus by the inventors of the present application.

Figure 4A:
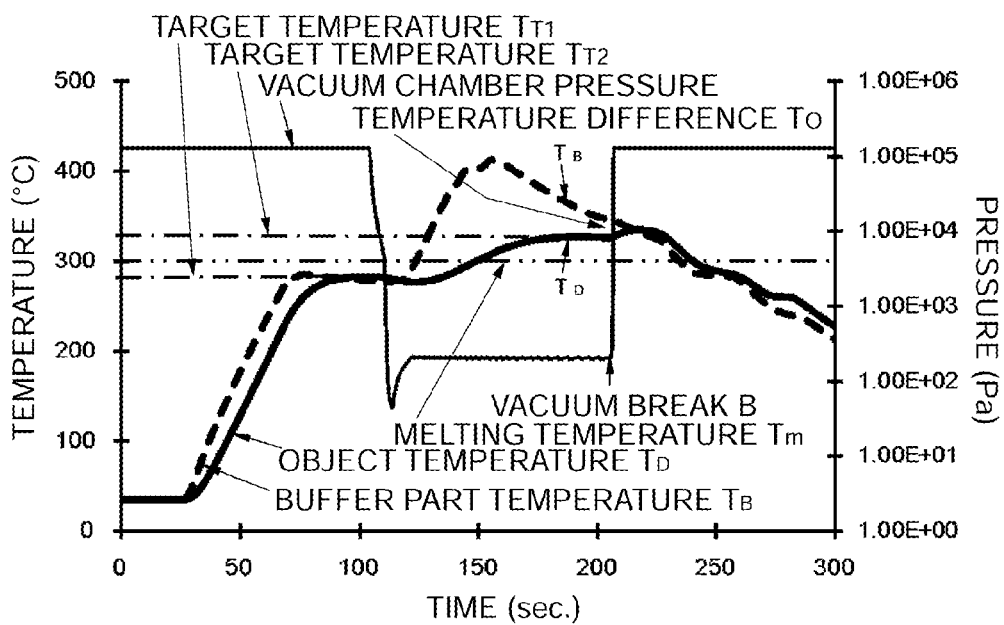
FIG. 4A is a drawing of a graph showing an example of the temperature control in the soldering apparatus according to the first embodiment of the present invention, and shows an example of the temperature control in the case where the buffer part is heated to the first heating target temperature slightly lower than the melting temperature of the solder and then the heat transfer waiting time is set for the temperature equalization.

The soldering apparatus 100 includes the object temperature sensor 40 for detecting the temperature $T_D$ of the object 1 to be soldered (see FIG. 4A). The object temperature sensor 40 is provided as a radiation thermometer that can detect the temperature (heat radiation temperature) $T_D$ of the object 1 without being blocked by the vacuum even in the vacuum. The object temperature sensor 40 detects the temperature $T_D$ of the electronic component 2 that is the most heat-sensitive component among the electronic component 2, the substrate 3, and the solder joint part 4 which form the object 1 to be soldered and sends the temperature to the controller 50. In the case where the temperature is controlled through the detection of the temperature $T_D$ of the most heat-sensitive electronic component 2 among the plurality of components forming the object 1, the object 1 can be prevented from being overheated in the safest way.

The object temperature sensor 40 according to this embodiment is provided so as to detect the temperature of only the most heat-sensitive object 1 among the plural (six) objects 1 to be soldered placed on the placing carriage table 5a and control the temperature for the heat treatment. In other words, the object temperature sensor 40 is provided so as to detect the temperature of the most heat-sensitive object 1 (electronic component 2) only and control the temperature of the entire soldering apparatus 100 for soldering six objects 1. The structure described above can eliminate the need for the detection of the temperature of the other plural (five) objects 1 to be soldered (electronic components 2) that are relatively resistant to heat. Thus, the soldering apparatus 100 can be provided more easily.

The soldering apparatus 100 includes the controller 50 for adjusting the heat application by the thermal radiation heater 20a and the heat discharge (cooling) by the cooling block 30a to control the temperature $T_D$ of the object 1 based on the temperature $T_D$ of the object 1 (see FIG. 4A) detected by the object temperature sensor 40. The controller 50 is a control computer that is provided to be programmable from an external source.

Figure 3A:
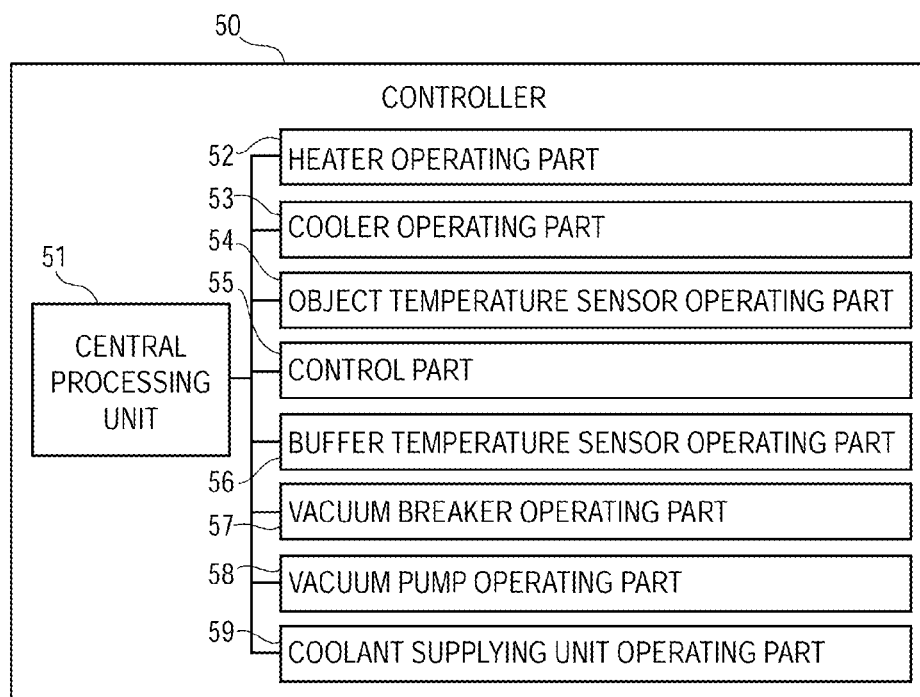
FIG. 3A is a block diagram showing the configuration of the controller included in the soldering apparatus according to the first embodiment of the present invention, which shows functional parts included in the controller.
Figure 3B:
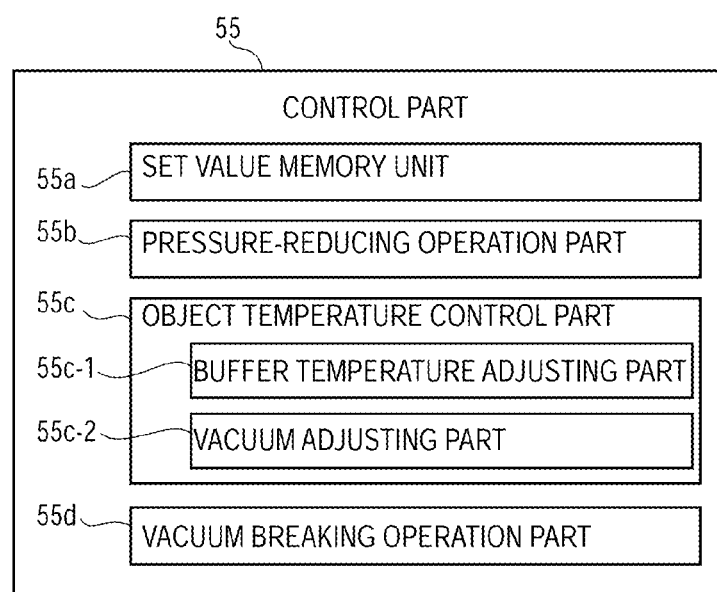
FIG. 3B is a block diagram showing the details of the functional parts included in the control part of the controller.

Referring now to FIG. 3A and FIG. 3B, the controller 50 is described. FIG. 3A is a block diagram showing functional parts included in the controller 50, and FIG. 3B is a block diagram showing the details of the functional parts included in a control part 55 of the controller 50. The controller 50 is provided so as to be capable of controlling operations of the soldering apparatus 100 in an integrated and centralized manner. The controller 50 includes the control part 55 for unifying the control and the operations performed by the controller 50 and a central processing unit 51 for processing information thereof. In addition, the controller 50 includes a plurality of operating parts (such as a heater operating part 52, for example) for independently operating actuating parts of the soldering apparatus 100.

Referring to FIG. 3B, the control part 55 included in the controller 50 is described. The control part 55 includes a set value memory unit 55a that stores control target values in advance for temperature control of the soldering apparatus 100. The control target values are temperature target values such as a first control target temperature $T_{T1}$ and a second control target temperature $T_{T2}$ (see FIG. 4A), for example. The set value memory unit 55a also stores drive setting values (such as a specified drive amount and driving speed, for example) for use in the operations of the actuating parts of the soldering apparatus 100. The set value memory unit 55a is typically provided as an information storage circuit (memory). The control part 55 reads the control target values and the drive setting values that are previously stored in the set value memory unit 55a when necessary. The control part 55 sets the read control target value as the control value of an object temperature control part 55c included in the control part 55. The control part 55 also sets the read drive setting values as respective dive setting values of a pressure-reducing operation part 55b and a vacuum breaking operation part 55d that are included in the control part 55.

The object temperature control part 55c adjusts the actuating parts of the soldering apparatus 100 by means of the buffer temperature adjusting part 55c-1 and a vacuum adjusting part 55c-2 that are included in the object temperature control part 55c so as to achieve the set control target values. Specifically, the buffer temperature adjusting part 55c-1 operates the heater operating part 52, a cooler operating part 53, and a coolant supplying unit operating part 59 (see FIG. 3A for each component) for adjustment therof. In addition, the vacuum adjusting part 55c-2 operates a vacuum breaker operating part 57 and a vacuum pump operating part 58 (see FIG. 3A for each component) to conduct the adjustment.

The pressure-reducing operation part 55b operates the vacuum breaker operating part 57 and the vacuum pump operating part 58 (see FIG. 3A for each component) so as to conduct a specified pressure-reducing operation by using the dive setting values that have been set. Furthermore, the vacuum breaking operation part 55d operates the vacuum breaker operating part 57 so as to conduct a specified vacuum breaking operation by using the dive setting value that has been set. The control part 55 is provided so as to be capable of storing the control target values that have been set and the records of driving operations and adjustments of the soldering apparatus 100 as control/operation history along time series. The temperature control performed by the object temperature control part 55c and the pressure-reducing operation and the vacuum breaking operation performed by the pressure-reducing operation part 55b and the vacuum breaking operation part 55d are described later in detail.

With reference to FIG. 3A, the operating parts included in the controller 50 are described. The heater operating part 52 is provided so as to be capable of energizing/stopping the energization of or adjusting the output of thermal radiation heater 20a (see FIG. 1A). The cooler operating part 53 is provided so as to be capable of changing and adjusting a driving position of the air cylinder for driving the cooling block 30a of the cooler 30 (see FIG. 1A, 1B). The object temperature sensor operating part 54 operates the object temperature sensor 40 (see FIG. 1A) so that the object temperature sensor outputs detected temperature information of the temperature $T_D$ of the object (see FIG. 4A) to the controller 50 with a specified sampling frequency.

The buffer temperature sensor operating part 56 to be described later in detail is also provided so as to be capable of operating the buffer temperature sensor 60 (see FIG. 1) in the same manner as the object temperature sensor operating part 54. The vacuum breaker operating part 57 changes and adjusts the driving position of the air cylinder for driving the gate valve 70a (see FIG. 2) and also drives a gas supply apparatus 70b (see FIG. 1A), a gas supply pump described later in detail, (and adjusts the flow rate) and opens and closes an inlet port 13 (see FIG. 1A). The vacuum pump operating part 58 drives (and adjusts the emission volume of) the vacuum pump 80 (see FIG. 1A) and also opens and closes an exhaust port 14 (see FIG. 1A). The control part 55 can operate the pressure gage 81 (see FIG. 1A) for detecting the pressure of the chamber interior so that the pressure gage outputs detected pressure information to the control part 55 with a specified sampling frequency. The coolant supplying unit operating part 59 is provided so as to be capable of driving a coolant supplying pump (not shown) (and adjusting the flow rate) and operating thermometer (not shown) to detect the temperature of the coolant.

Returning to FIG. 1A, 1B, the description continues further. In this embodiment, the object temperature control part 55c (see FIG. 3B) included in the controller 50 adjusts thermal radiation heater 20a so that the heater radiates heat with a constant heat radiation output. The constant heat radiation output is determined such that the object 1 to be heated through the placing carriage table 5a is heated with a predetermined temperature rise rate (temperature (Degree C))/time (sec.)). The temperature rise rate of the object 1 at that time can be determined in accordance with capacity of the temperature control such as heat capacities of the placing carriage table 5a and the object 1, response speed of the temperature control, and an error so that the temperature $T_D$ of the object 1 (see FIG. 4A) can be controlled through cooling after heating. For example, the temperature rise rate of the object 1 is selected so that the maximum temperature rise rate is achieved within the range in which the temperature can be controlled after heating. In this embodiment, the object temperature control part 55c included in the controller 50 substantially turns on/off thermal radiation heater 20a for adjusting. Thermal radiation heater 20a starts to heat the placing carriage table 5a (and the object 1) through a heating starting operation by the heater operating part 52 (see FIG. 3A) with the specified heat radiation output previously recorded in the set value memory unit 55a of the controller 50 (see FIG. 3B).

In this embodiment, the placing carriage table 5a (and the object 1) is heated under atmospheric pressure without reduction in pressure of the chamber interior. When the placing carriage table 5a is heated under the atmospheric pressure, the heat transfer between the placing carriage table 5a and the object 1 is not blocked by the vacuum. The temperature increase (rise) of the object by heat transfer gets significantly behind the temperature rise of the placing carriage table 5a in terms of time because of heat transfer time required for heat transfer and heat conduction (see FIG. 4A). However, when the heating is conducted under the atmospheric pressure, no large difference in heating temperatures achieved by the placing carriage table 5a and the object 1 is made, and both the placing carriage table 5a and the object 1 can be heated to the first control target temperature $T_{T1}$ that is approximately equal to each other (see FIG. 4A).

The controller 50 is preferably operated so as to air tightly seal the vacuum chamber 10 in which the object 1 is loaded in advance before starting to heat with thermal radiation heater 20a. The vacuum chamber 10 can be sealed through the operation of the gate valve 70a (see FIG. 2) by means of the vacuum breaker operating part 57 (see FIG. 3A) included in the controller 50. In this case, the heating by thermal radiation heater 20a can efficiently be conducted inside the well-insulated and sealed chamber. In addition, this embodiment is safe because thermal radiation heater 20a does not apply a large amount of heat to an exterior of the vacuum chamber 10.

The object temperature control part 55c (see FIG. 3B) included in the controller 50 suspends the heating by thermal radiation heater 20a when the temperature $T_D$ of the object 1 (see FIG. 4A) reaches the specified first control target temperature $T_{T1}$ (see FIG. 4A) lower than the melting temperature (melting point) $T_m$ of the solder (see FIG. 4A). This is because the pressure of the chamber interior is reduced to reach a vacuum before the solder melts and an oxide film is prevented from being formed on the surface of the solder. In the case where the pressure of the chamber interior is reduced to a vacuum before the solder melts, the solder melts in the vacuum, and a conducting point between the electronic component 2 and the substrate 3 gets wet by the solder, the soldering of the conducting point is not blocked by the oxide film. In this case, good soldering can be achieved which has good electrical conductivity and strong mechanical fixation. The controller 50 allows the set value memory unit 55a (see FIG. 3B) included in the control part 55 to store the record of the melting temperature (melting point) $T_m$ of the solder. In this embodiment, the heating is suspended when the detected temperature $T_D$ of the object 1 reaches the first target temperature $T_{T1}$ (280 degrees Celsius) lower by 20 degrees Celsius than the melting point $T_m$ of the solder that is 300 degrees Celsius.

In this embodiment, the pressure of the chamber interior is not reduced immediately after the object 1 is heated to the first heating target temperature $T_{T1}$ (see FIG. 4A) by thermal radiation heater 20a, but the placing carriage table 5a and the object 1 are placed in the atmosphere, and the heat transfer waiting time is set for waiting the heat transfer in order for the temperature equalization to be spread over the entire component (see FIG. 4A). The configuration as described above can ensure the heat transferring time required to adequately conduct the efficient heat transfer from the placing carriage table 5a to the object 1 in the atmosphere having a high rate of heat transfer (heat transfer rate). Thus, the temperature of every part of the placing carriage table 5a and the object 1 can be brought to the equal and uniform first target temperature $T_{T1}$. As described above, the pressure of the chamber interior is reduced in a state where the temperature of every part of the placing carriage table 5a and the object 1 is adequately equalized.

As described above, because thermal diffusion (natural cooling) from the object 1 and the placing carriage table 5a to the atmosphere is blocked when the pressure of the chamber interior is reduced toward reach the vacuum, the object 1 may be overheated. Thus, the controller 50 starts to control the temperature of the object 1 by having the buffer temperature adjusting part 55c-1 (see FIG. 3B) adjust the heat discharge (cooling) by the cooling block 30a before reducing the pressure of the chamber interior. The adjustment of the heat discharge (cooling) by the cooling block 30a is performed through a change in the amount of discharged (cooled) heat per unit time from the placing carriage table 5a. The controller 50 starts to drive the vacuum pump 80 to reduce the pressure of the chamber interior through the pressure-reducing operation part 55b (see FIG. 3B) after starting to control the temperature of the object 1 through the adjustment of the heat discharge (cooling). The pressure of the chamber interior is reduced to the medium vacuum lower than 100 Pa through the discharge of air by the vacuum pump 80 (see FIG. 4A).

In the heating by the heater 20 such as thermal radiation heater 20a, the object 1 and the placing carriage table 5a continues to be heated by the residual heat liberated by a heat generating part such as a heating wire of the heater 20 heated to a high temperature even after electrical heating of the heater 20 terminates. In other words, heating does not terminate even if energization of the heater 20 is terminated (turned off). Thermal diffusion from the heated object 1 and placing carriage table 5a to the atmosphere cannot be expected in a vacuum. Thus, the temperature control of the vacuum soldering apparatus for soldering in a vacuum has a tendency to overshoot in which the temperature $T_D$ of the object 1 (see FIG. 4A) exceeds the control target temperature $T_{T2}$ (see FIG. 4A) in comparison with the case in the temperature control of the conventional soldering apparatus for soldering in ambient air or a reducing gas atmosphere (see Claim 1 of Patent Document 1, for example). Heating overshoot of the object 1 has a possibility of thermal destruction of the object 1 and causes an increase in cooling time.

The conventional soldering apparatus in which the temperature is controlled by detecting the temperature of the placing table (see Claim 1 and Claim 7 of Patent Document 1, for example) could not accurately control the temperature of the object in a vacuum. The conventional soldering apparatus was provided so that the soldering is performed in the reducing gas atmosphere or ambient air to avoid a vacuum where the object might be overheated. In the case where such a conventional soldering apparatus was used to solder in a vacuum, change in heat transfer (rate of heat transfer (heat transfer coefficient)) between the placing table and the object associated with the pressure reduction of the chamber interior was left out of the control and not managed. Thus, in the case where the conventional soldering apparatus was used to solder in a vacuum, heating overshoot of the object had to be prevented while imperfections in control were complemented. The amount of heat application by the heater had to be reduced, and the temperature rise rate (Temperature (Degree C)/Time (sec.)) of the object had to be decreased. The heating by the heater had to be terminated in the early stages before the temperature of the object adequately rose in comparison with the melting point of the solder, and the object had to be heated with the residual heat over time. In addition, the object could not be heated well to the heating target temperature required in soldering. As described above, in the case where the conventional soldering apparatus was used to solder in a vacuum, a long cycle time was required. The object was subjected to thermal destruction due to imperfections in temperature control. On the contrary, due to insufficient heating, inadequate soldering was performed in some cases.

On the other hand, the soldering apparatus 100 according to the present application is provided to adjust heating and heat discharge (cooling) in a vacuum based on the detected temperature $T_D$ of the object 1 to be soldered (see FIG. 4A). Thus, the change in heat transfer (rate of heat transfer (heat transfer coefficient)) between the placing table 5a and the object 1 can be incorporated into the temperature control of the object 1 and managed. Specifically, all of the changes in the heat transfer between the placing table 5a and the substrate 3, the heat transfer between the substrate 3 and the solder joint part 4, and the heat transfer between the solder joint part 4 and the electronic component 2 can be incorporated into the control and managed. In addition, the change in the heat transfer between the placing carriage table 5a and the cooling block 30a when heat of the placing carriage table 5a is discharged (cooled) with the cooling block 30a can be incorporated into the control and managed. Thus, the temperature can be adequately controlled during soldering in a vacuum. The configuration as described above can achieve reliable heating and soldering of the object 1 to the heating target temperature $T_{T2}$ (see FIG. 4A) in a vacuum. The temperature $T_D$ of the object 1 does not too much overshoot beyond the heating target temperature $T_{T2}$, and the object 1 is not subjected to thermal destruction. The soldering can efficiently be performed in a short cycle time.

In the soldering apparatus 100 according to this embodiment, the placing carriage table 5a is heated by the residual heat of thermal radiation heater 20a. Thermal diffusion of the placing carriage table 5a to ambient air is also blocked in the vacuum of the chamber interior in the same manner as the object 1. Thus, the temperature $T_B$ of the placing carriage table 5a (see FIG. 4A) sharply rises after the pressure of the chamber interior is reduced toward a vacuum. That is to say, the placing carriage table 5a is heated to a high temperature instead of the object 1. However, the placing carriage table 5a is not subjected to thermal destruction even if heated to a high temperature in contrast to the heat-sensitive object 1.

The heat of the placing carriage table 5a is discharged (cooled) by the cooling block 30a as described above. Thus, the excess heat amount exceeding the heat amount to be transferred to the object 1 by the placing carriage table 5a is drawn by the cooling block 30a before transferred to the object 1. The temperature $T_B$ of the placing carriage table 5a (see FIG. 4A) rises sharply and then drops, and thus the temperature difference between the temperature $T_B$ and the temperature $T_D$ of the object 1 (see FIG. 4A) becomes small. On the other hand, the temperature $T_D$ of the object 1 is accurately controlled to the specified target temperature $T_{T2}$ (see FIG. 4A) through the heat discharge (cooling) adjustment by the cooling block 30a. The heat capacity of the placing carriage table 5a is defined to be the amount of heat capacity in which the placing carriage table can function as the buffer part.

The object temperature control part 55c (see FIG. 3B) of the control part 55 included in the controller 50 drives the cooling block 30a to control the temperature of the object 1. The object temperature control part 55c performs PID control (proportional-plus-integral-plus-derivative control) so that the temperature $T_D$ (see FIG. 4A) of the object 1 detected by the object temperature sensor 40 is to be the specified control target temperature $T_{T2}$ (see FIG. 4A). The melting temperature (melting point) $T_m$ of the solder (see FIG. 4A) exemplified in this embodiment is 300 degrees Celsius, and the specified control target temperature $T_{T2}$ is 325 degrees Celsius which slightly exceeds the melting temperature $T_m$. In order to achieve the control target temperature $T_{T2}$, the buffer temperature adjusting part 55c-1 (see FIG. 3B) included in the object temperature control part 55c adjusts the heat discharge (cooling) of the placing carriage table 5a by operating the cooling block 30a through the cooler operating part 53 (see FIG. 3A). As described above, the temperature control of the object 1 is conducted through the adjustment of contact time of the placing carriage table 5a with the cooling block 30a in this embodiment.

The control part 55 of the controller 50 (see FIG. 3B) is expected to cool the object 1 as soon as possible after the temperature $T_D$ (see FIG. 4A) of the object 1 detected by the object temperature sensor 40 reaches the specified control target temperature $T_{T2}$ (see FIG. 4A). In this case, a newly specified third control target temperature $T_{T3}$ (not shown) can be changed to room temperature of 24 degrees Celsius, for example, in accordance with the control target temperature information stored in the set value memory unit 55a (see FIG. 3B) included in the control part 55. In order to cool the object 1 quickly, the object 1 is preferably cooled through natural cooling (atmosphere) by the immediate vacuum break of the chamber interior and recovery of thermal diffusion from the object 1 to the atmosphere in addition to the cooling with the cooling block 30a. However, the object may be overheated due to the vacuum break as described above when there is a temperature difference between the temperature $T_B$ of the placing carriage table 5a (see FIG. 4A) and the temperature $T_D$ of the object 1.

In this embodiment, the soldering apparatus 100 further includes the buffer temperature sensor 60 for detecting the temperature $T_B$ of the placing carriage table 5a (see FIG. 4A). The buffer temperature sensor 60 is provided as a radiation thermometer that can detect the temperature (heat radiation temperature) $T_B$ of the placing carriage table 5a without blockage of the vacuum even in the vacuum. The buffer temperature sensor 60 detects the heat radiation temperature $T_B$ at a specified position located in the center of the placing carriage table 5a and transmits it to the controller 50. The temperature $T_B$ of the placing carriage table 5a is uniform over the table, and thus the buffer temperature sensor 60 may detect the temperature $T_B$ at one arbitrary position in the placing carriage table 5a.

In order to prevent the overheating of the object 1, the soldering apparatus 100 performs a vacuum break B (see FIG. 4A), considering heat input acceptable to the heat-sensitive object 1 (electronic component 2). In this case, the maximum temperature difference $T_O$ (see FIG. 4A) between the placing carriage table 5a and the object 1 can be determined in advance where the vacuum break B can be performed. The controller 50 allows the set value memory unit 55a (see FIG. 3B) included in the control part 55 to store the record of the specified temperature difference $T_O$ as a condition for the vacuum break B. Thus, the controller 50 can control to perform the vacuum break B after the temperature $T_D$ of the object 1 (see FIG. 4A) reaches the specified target temperature $T_{T2}$ (see FIG. 4A) and at the earliest possible time when the temperature difference between the placing carriage table 5a and the object 1 reaches the specified temperature difference $T_O$ or below.

To perform the vacuum break B of the chamber interior (see FIG. 4A), the vacuum breaker operating part 57 (see FIG. 3A) included in the controller 50 operates and opens the gate valve 70a (see FIG. 2) as the vacuum breaker 70 according to the command from the vacuum breaking operation part 55d (see FIG. 3B). Thus, the pressure inside the chamber recovers rapidly to atmospheric pressure. In the case where the temperature difference between the placing carriage table 5a and the object 1 is smaller than or equal to the specified temperature difference $T_O$ (see FIG. 4A), the temperature rise of the object 1 associated with the vacuum break B is small within an acceptable range (see FIG. 4A), and the object 1 is not damaged by heat. The temperature difference between the placing carriage table 5a and the object 1 can gradually be eliminated through the vacuum breaking operation with feedback control by means of the vacuum breaker 70 as described later in detail. A dedicated vacuum breaking valve (not shown) may be provided in place of the gate valve 70a. At that time, the vacuum break B can be performed while the degree of vacuum is adjusted delicately. The gate valve 70a can easily open and close after the vacuum break B is performed.

In addition, the vacuum break B of the chamber interior is determined to be performed on the condition that the temperature $T_D$ of the object 1 (see FIG. 4A) detected by the object temperature sensor 40 is higher than or equal to the melting temperature $T_m$ of the solder (see FIG. 4A). In the case described above, molten solder can solidifies under atmospheric pressure. The configuration as described above can crush voids by applying the atmospheric pressure to the solder in the molten state even when the voids (cavities) develop in the solder joint part 4, and thus the solder does not solidify with the voids substantially remaining in the solder joint part 4. The voids are crushed at least in size (volume) that does not affect the quality of soldering. Thus, highly reliable soldering can be conducted with strong mechanical bonding and excellent electrical conductivity.

As described in this embodiment, a void hardly develops in the solder joint part 4 when the solder is heated in a vacuum to the melting temperature (melting point) $T_m$ (see FIG. 4A), in comparison with the conventional soldering apparatus (see Claim 1 of Patent Document 1, for example) for heating the solder to the melting temperature (melting point) or above in the reducing gas atmosphere or ambient air. Furthermore, the pressure inside the void is under vacuum even when the void develops in the solder joint part 4 such as the contact face between the electronic component 2 or substrate 3 and the solder joint part 4, and thus the void can be shrunk and crushed through restoration of the pressure inside the chamber to atmospheric pressure before the solder solidifies. In the soldering with the soldering apparatus 100 according to this embodiment, the void developing inside the solder joint part 4 shrinks in volume as the pressure inside the chamber restores atmospheric pressure.

In the conventional soldering apparatus, the void developing under atmospheric pressure may expand and burst in a vacuum, resulting from pressure reduction of the chamber interior after melting of the solder under atmospheric pressure. In addition, the solder may scatter when the void expands and bursts in the conventional soldering apparatus. Scattering of the solder has a possibility of greatly deteriorating quality of soldered products. On the other hand, the soldering apparatus 100 according to this embodiment melts the solder in a vacuum and thus prevents the void from expanding and bursting in a vacuum and the solder from flying apart unlike the conventional soldering apparatus and can perform good soldering.

The object 1 can be naturally cooled when the vacuum break B (see FIG. 4A) is conducted, and thus the temperature $T_D$ of the object 1 (see FIG. 4A) drops sharply. The vacuum breaking operation part 55d (see FIG. 3B) included in the controller 50 typically moves the gate valve 70a (see FIG. 2) to perform the vacuum break B. Specifically, the gate valve 70a at a closed position is driven to slide to an open position of the gate valve 70a where the soldered object 1 can be transferred out of the chamber interior. The vacuum breaker operating part 57 (see FIG. 3A) operated by the vacuum breaking operation part 55d operates the gate valve 70a to drive it to the open position as fast as possible with the maximum transfer rate.

On the other hand, the vacuum breaking operation part 55d (see FIG. 3B) can perform the vacuum break B (see FIG. 4A) so as to control the temperature $T_D$ of the object 1 (see FIG. 4A). The vacuum breaking operation part 55d can perform the temperature control of the object 1 by adjusting the opening and closing of the gate valve 70a (see FIG. 2) as the vacuum breaker 70 in accordance with the temperature $T_D$ of the object 1 detected by the object temperature sensor 40. When the gate valve 70a is opened to restore the pressure of the chamber interior, the heat transfer (rate of heat transfer (heat transfer coefficient)) from the placing table 5a to the object 1 through the atmosphere is regained. At that time, the rise rate of the temperature $T_D$ of the object 1 (Temperature (degree C.)/Time (sec.)) increases as time elapsing, and the temperature $T_D$ of the object 1 increases at an accelerated rate. On the contrary, when the gate valve 70a is closed again, the restoration of the pressure of the chamber interior is discontinued, and regaining of the heat transfer (rate of heat transfer (heat transfer coefficient)) through the atmosphere is interrupted. In this case, the increase in the rise rate of the temperature $T_D$ of the object 1 is interrupted. The rise of the temperature $T_D$ of the object 1 gets slow at that time.

Furthermore, the controller 50 can perform the vacuum break B (see FIG. 4A) with a combination of the pressure-reducing operation conducted by driving the vacuum pump 80 and the vacuum breaking operation. The vacuum adjusting part 55c-2 (see FIG. 3B) provided in the object temperature control part 55c of the control part 55 included in the controller 50 can reduce the pressure inside the chamber by driving the vacuum pump 80 when the vacuum break B is conducted. At that time, the controller 50 can control the temperature $T_D$ of the object 1 by adjusting the driving and stopping (maneuvering) of the vacuum pump 80 in accordance with the temperature $T_D$ of the object 1 (see FIG. 4A) detected by the object temperature sensor 40. When the pressure of the chamber interior is reduced, the heat transfer from the placing table 5a to the object 1 through the atmosphere is blocked or attenuated. Thus, the increase in the temperature $T_D$ of the object 1 is interrupted.

As described above, the controller 50 can adjust the restoration of the pressure of the chamber interior during the vacuum break B (see FIG. 4A) by adjusting the gate valve 70a (see FIG. 2) and the vacuum pump 80 in combination. The heat transfer (rate of heat transfer (heat transfer coefficient)) from the placing table 5a to the object 1 through the atmosphere is adjusted so as to increase or decrease accordingly, and the temperature $T_D$ of the object 1 (see FIG. 4A) can be controlled. Thus, the overheating of the object 1 can be prevented. In practice, the dedicated vacuum breaking valve described above is preferably used for adjusting the restoration of the pressure of the chamber interior. The vacuum breaking valve in that case is typically a globe valve or needle valve.

The temperature difference between the temperature $T_B$ of the placing carriage table 5a (see FIG. 4A) and the temperature $T_D$ of the object 1 (see FIG. 4A) can be controlled to be smaller than or equal to the specified temperature difference $T_O$ (see FIG. 4A) through a similar adjustment of the restoration of the pressure inside the chamber. As described above, the vacuum break B (see FIG. 4A) is performed when the temperature difference in both temperatures becomes the specified temperature difference $T_O$ or smaller. When the temperature difference in both temperatures is bigger than the specified temperature difference $T_O$, the vacuum break B is put on standby until the heat transfer proceeds and the temperature difference achieves the specified temperature difference $T_O$ or smaller. At that time, the temperature difference in both temperatures can be controlled to be smaller than or equal to the specified temperature difference $T_O$ through the adjustment of the pressure restoration so that heat transfer is conducted with the maximum heat flow rate (Heat transfer quantity/Time (sec.)) from the placing carriage table 5a to the object 1 while the overheating of the object 1 is prevented. The configuration as described above can arrange a condition for efficiently eliminating the temperature difference in both temperatures to perform the vacuum break B at the earliest possible stage. The object 1 can efficiently be cooled through the vacuum break B at the earliest possible stage, and thus the cycle time required for soldering can be shortened.

The soldering apparatus 100 further includes the gas supply apparatus 70b as another vacuum breaker 70. The gas supply apparatus 70b is a gas supply pump that is connected to the inlet port 13 of the vacuum chamber 10 and can supply reducing gas such as formic acid gas, inert gas such as nitrogen gas and argon gas, or ambient air into the chamber. The vacuum break B (see FIG. 4A) can be performed through driving and adjustment of flow rate of the gas supply apparatus 70b to supply of inert gas such as nitrogen gas or ambient air into the chamber, instead of opening and closing actuation of the gate valve 70a (see FIG. 2) described above. Alternatively, the vacuum break B can be performed more efficiently through driving and adjustment of the gas supply apparatus 70b and the gate valve 70a in combination.

In this embodiment, the gas supply apparatus 70b is provided so as to supply the nitrogen gas into the chamber and adjust the pressure (degree of vacuum) of the chamber interior after the gate valve 70a (see FIG. 2) closes the chamber interior in accordance with the control by the vacuum adjusting part 55c-2 (see FIG. 3B) provided in the object temperature control part 55c of the control part 55 included in the controller 50. The structure as described above can freely adjust the pressure of the chamber interior by combining the adjustment of the supply of nitrogen gas with the gas supply apparatus 70b with the discharge of air inside the chamber through the vacuum pump 80. In this case, the pressure of the chamber interior can be adjusted freely without relying on the gate valve 70a, while the vacuum chamber 10 is sealed. As described above, the restoration of the pressure by the vacuum break B (see FIG. 4A) can be adjusted freely through the vacuum breaker 70 and the vacuum pump 80 in combination. In addition, the temperature of the object or the temperature difference between the object and the buffer part can preferably be controlled through the adjustment of the degree of vacuum of the chamber interior.

Figure 2:
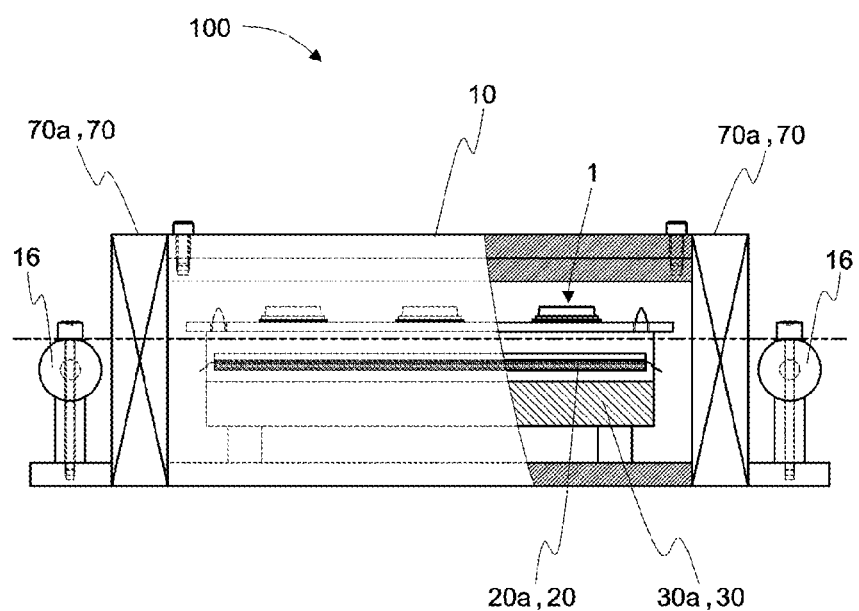
FIG. 2 is a partially cross-sectional side view showing an example of the soldering apparatus according to the first embodiment of the present invention. It is a partially cross-sectional view, a side view of the soldering apparatus according to the first embodiment, showing an internal configuration by cutting a part of the partition wall of the vacuum chamber.

Referring to FIG. 2, the soldering apparatus 100 according to this embodiment is further described. FIG. 2 is a partial cross-sectional view in which a part of the vacuum chamber 10 of the soldering apparatus 100 is cut away and viewed from a side. FIG. 2 is a view intended to show the arrangement of the gate valve 70a included in the soldering apparatus 100 with respect to the vacuum chamber 10, and other components are omitted from the drawing to facilitate understanding. The gate valves 70a are disposed on a pair of the walls of the vacuum chamber 10 so as to traverse the conveyor line of the object 1 to be soldered. The conveyor line for conveying the object 1 is constructed with a plurality of external conveying rollers 16 that forms the conveyor line outside the vacuum chamber 10 and a plurality of conveying rollers 11 (see FIG. 1A) that form the conveyor line of the chamber interior described above. The gate valve 70a opens when the object 1 to be soldered is transferred into the chamber interior through the conveyor line or the soldered object 1 is transferred out of the chamber interior. At that time, the gate valve 70a slides to open from the closed position of the gate valve 70a to the vertically upper side of the soldering apparatus 100. The gate valve 70a can seal the chamber interior as described above when the gate valve 70a is in the closed position.

Figure 4B:
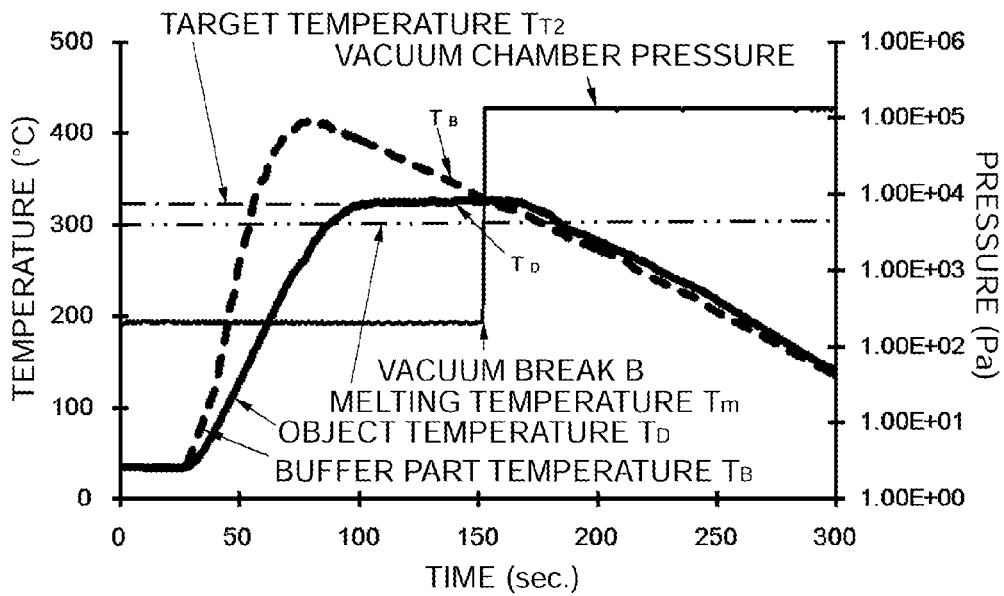
FIG. 4B is a drawing of a graph showing another example of the temperature control of the first embodiment in the case where the heat transfer waiting time is not set.

Referring to FIG. 4A, 4B, the control of the heat treatment by the soldering apparatus 100 according to this embodiment is further described. FIG. 4A, 4B are charts showing an example of the control of the heat treatment by the soldering apparatus 100. FIG. 4A shows an example of the temperature control in the case where the buffer part is heated to the first heating target temperature $T_{T1}$ slightly lower than the melting temperature of the solder and then the heat transfer waiting time is set for the temperature equalization, and FIG. 4B shows an example of the temperature control in the case where the heat transfer waiting time is not set. The horizontal axis shows time course (in seconds), the left vertical axis shows centigrade temperatures, and the right vertical axis shows the pressure of the chamber interior (Pa). The temperature $T_D$ of the object 1 (see FIG. 1A) detected by the object temperature sensor 40 (see FIG. 1A) is shown with a thick solid line, and the temperature $T_B$ of the placing carriage table 5a (see FIG. 1A) detected by the buffer temperature sensor 60 (see FIG. 1A) is shown with a thick dashed line. The pressure of the chamber interior detected by the pressure gage 81 (see FIG. 1A) is shown with a thin solid line. The specified control target temperature $T_{T2}$ for soldering the exemplary object 1 is 325 degrees Celsius, and the melting temperature (melting point) $T_m$ of the solder in this embodiment is 300 degrees Celsius.

With reference to FIG. 4A, an example of the temperature control of the soldering apparatus 100 is described along the time course. In the example shown, the heating of the placing carriage table 5a (see FIG. 1) by thermal radiation heater 20a (see FIG. 1A) starts from a lapse of approx. 30 seconds. As described above, a slight time difference arises between the increase of the temperature $T_B$ of the placing carriage table 5a and the increase of the temperature $T_D$ of the object 1 (see FIG. 1A). However, the object 1 is energized and heated to the first control target temperature $T_{T1}$ (approx. 280 degrees Celsius) slightly lower than 300 degrees Celsius that is the melting temperature (melting point) $T_m$ of the solder according to this embodiment with a high temperature rise rate (Temperature (Degree C)/Time (sec.)) for approx. 40 seconds until a lapse of approx. 70 seconds when the heating is completed. In this embodiment, the heat transfer waiting time is set, as described above, for the temperature equalization in which the heating by thermal radiation heater 20a is transferred and conducted to the entire part, from a lapse of approx. 70 seconds to approx. 100 seconds after the first control target temperature $T_{T1}$ is achieved.

After the first control target temperature $T_{T1}$ is achieved, as described above, the adjustment of the heat discharge (cooling) of the placing carriage table 5a (see FIG. 1A) by the cooling block 30a (see FIG. 1A, 1B) starts, and the pressure of the chamber interior is reduced to the medium vacuum of approx. 100 Pa. A vacuum produced in the chamber interior causes the heat transfer between the placing carriage table 5a and the object 1 (see FIG. 1A) to be blocked, and thus the temperature difference arises in both temperatures. The temperature of the object 1 hardly increases due to the blockage or deterioration of the heat transfer. In order to shorten the cycle time, it is desirable that the object 1 is heated further through the placing carriage table 5a. Thus, this embodiment continues the heating by energizing thermal radiation heater 20a (see FIG. 1A) again. The electrical heating is appropriately adjusted to turn on/off in response to a temperature control request for the object 1. In this case, the cycle time can be shortened further in comparison with the case where heat is applied only by the residual heat of thermal radiation heater 20a finishing the electrical heating. Thus, the temperature $T_B$ of the placing carriage table 5a diverges from the temperature $T_D$ of the object 1 and sharply increases. In the soldering apparatus 100, the heating temperature $T_B$ of the placing carriage table 5a is not limited to the heating target temperature $T_{T2}$ of the object 1 or lower by the control, unlike the conventional apparatus. The temperature $T_B$ of the placing carriage table 5a increases to exceed the target temperature $T_{T2}$ of the object 1; however, the controller 50 (see FIG. 1A) continues to perform efficient and appropriate controls in accordance with the temperature $T_D$ of the object 1 detected by the object temperature sensor 40 (see FIG. 1A). Thus, the controller 50 does not allow the temperature $T_D$ of the object 1 to overshoot and can set it to the specified control target temperature $T_{T2}$ of 325 degrees Celsius in a shorter time and with higher efficiency and accuracy than the conventional apparatus.

The controller 50 (see FIG. 1A) calculates the temperature difference between the temperature $T_D$ of the object 1 and the temperature $T_B$ of the placing carriage table 5a (see FIG. 1A) respectively detected by the object temperature sensor 40 and the buffer temperature sensor 60 (see FIG. 1A) after the temperature $T_D$ of the object 1 (see FIG. 1A) reaches the specified target temperature $T_{T2}$. When the calculated temperature difference is smaller than or equal to the specified temperature difference $T_O$ that is determined so as not to thermally damage the object 1 through the vacuum break B, the controller 50 operates the gate valve 70a (see FIG. 2) to perform the vacuum break B. When the temperature difference is bigger than the specified temperature difference $T_O$, the controller operates the vacuum breaker 70 (gate valve 70a (see FIG. 2) and/or the gas supply apparatus 70b (see FIG. 1A) and thus quickly adjusts and eliminates the temperature difference between the temperature $T_B$ of the placing carriage table 5a and the temperature $T_D$ of the object 1. The controller operates the vacuum breaker 70 to restore the pressure of the chamber interior to atmospheric pressure after the temperature difference between the temperature $T_B$ of the placing carriage table 5a and the temperature $T_D$ of the object 1 becomes smaller than or equal to the specified temperature difference $T_O$ and while the temperature $T_D$ of the object 1 is higher than or equal to the melting temperature (melting point) $T_m$ of the solder.

The increase in the temperature $T_D$ of the object 1 (see FIG. 1A) associated with the vacuum break B is controlled to be a slight temperature increase as shown in the drawing. Natural cooling through ambient air is recovered after the vacuum break B, and thus the temperature $T_D$ of the object 1 and the temperature $T_B$ of the placing carriage table 5a (see FIG. 1A) sharply decrease. At this time, the decrease in the temperature $T_B$ of the placing carriage table 5a cooled in combination with the cooling block 30a (see FIG. 1A, 1B) precedes the decrease in the temperature $T_D$ of the object 1 by a small time difference.

Good soldering can be achieved through the control of the soldering apparatus 100 as described above, in which the object 1 (see FIG. 1A) is not subjected to thermal destruction but can securely be heated to the specified heating target temperature $T_{T2}$ and soldered, and the cycle time for soldering can be shortened as well. The soldering with the soldering apparatus 100 according to this embodiment can shorten the cycle time by approx. 40 seconds as compared with the soldering with the conventional soldering apparatus (see Claim 1 of Patent Document 1, for example).

The soldering apparatus 100 according to this embodiment is described as simultaneously heat-treating and soldering the plural (six) objects 1; however, other embodiments may heat-treat and solder only one object 1 to be soldered by the soldering apparatus 100. In this case, heat-treatment (temperature control) exclusively suitable for soldering only one object 1 to be soldered can be performed without considering the state of heat-treatment of other objects 1.

This embodiment is described such that the temperature $T_D$ of the most heat-sensitive object 1 among the plural (six) objects 1 is detected with one object temperature sensor 40 and the soldering is performed. However, other embodiments may detect all of the temperature $T_D$ of the plural objects 1 to be heat-treated with a plurality of object temperature sensors 40 and apply all of the detected temperature $T_D$ of the objects 1 to the temperature control of the soldering apparatus 100. In this case, further precise temperature control of all objects 1 can be performed.

This embodiment is described such that the object temperature sensor 40 and the buffer temperature sensor 60 are provided as the radiation thermometers that can detect the temperature without blockage of the vacuum. However, other embodiments may be provided with contact thermometers as the temperature sensors which come into contact with the object 1 and the placing carriage table 5a and detect the temperatures, respectively. A thermocouple can be used as the contact thermometer, for example. In this case, thermocouple can be provided to be embedded in the placing carriage table 5a so as to detect the temperature $T_B$ of the placing carriage table 5a. Thermocouple in the above case is not blocked by the reflections of heat radiation inside the chamber and can detect the temperatures more readily. In addition, thermocouple has a simpler mechanical structure and thus can be provided in the soldering apparatus 100 more easily.

This embodiment is described such that the object temperature sensor 40 detects the temperature $T_D$ of the electronic component 2 forming the object 1. However, other embodiments may be provided with the object temperature sensor 40 for detecting the temperature $T_D$ of the substrate 3 forming the object 1. Also in this case, the change in the heat transfer (rate of heat transfer (heat transfer coefficient)) between the substrate 3 forming the object 1 to be soldered and the placing carriage table 5a can be incorporated into the control, and the temperature for soldering can be controlled appropriately even in a vacuum.

Thermal radiation heater 20a according to this embodiment is described as a halogen heater. However, other embodiments may be provided with a carbon heater that encloses a carbon fiber filament in inert gas as thermal radiation heater 20a. In this case, the heater can radiate much more infrared rays with a wavelength range between approx. 2 µm and approx. 4 µm close to the wavelength of absorption spectrum peak of water (approx. 3 µm wavelength). Thus, when the object 1 has a water content (the electronic component such as a semiconductor package and the substrate typically have some hygroscopic properties), the carbon heater as the thermal radiation heater 20a can preferably apply heat to the object 1 through water contained in the object 1 and thus can efficiently apply heat to the object 1. Further other embodiments may be provided with a nichrome wire heater that encloses a nichrome filament in air as thermal radiation heater 20a. In this case, thermal radiation heater 20a con be provided more easily.

Thermal radiation heater 20a according to this embodiment is described as being provided in rod shape. However, thermal radiation heater 20a in another embodiment may be provided in any shape such as arc shape and sphere shape corresponding to the shape and the arrangement of the solder joint part 4 of the object 1.

This embodiment is described such that the soldering apparatus 100 reduces the pressure of the chamber interior to a vacuum when the temperature $T_D$ of the object 1 is heated to the specified first control target temperature $T_{T1}$ lower than the melting temperature (melting point) $T_m$ of the solder. However, other embodiment may be configured to reduce the pressure of the chamber interior to produce a vacuum after the temperature $T_D$ of the object 1 is heated to the melting temperature (melting point) $T_m$ of the solder or higher within the range where the formation of the oxide film on the surface of the solder joining the conducting point of the object 1 is not harmful so as to substantially affect the quality of soldering (such as mechanical bonding strength and electrical conductivity). In this case, the time for heating the object 1 in ambient air can be increased further, and thus the object 1 can be heated more efficiently.

The temperature control of the soldering apparatus 100 in this embodiment is described such that the specified heat transfer waiting time is set for equalizing the temperature of entire parts of the placing carriage table 5a and the object 1 after the heating to the first heating target temperature $T_{T1}$ by thermal radiation heater 20a is completed. However, the soldering apparatus 100 may be operated under temperature control without setting the heat transfer waiting time as shown in FIG. 4B. In this case, heating can be performed with the second heating target temperature $T_{T2}$ determined as a control target temperature from the start of heating, and the heat transfer waiting time can be saved. Thus, the cycle time for soldering can be shortened furthermore.

This embodiment is described such that the pressure of the chamber interior is reduced to a vacuum after the heating to the first heating target temperature $T_{T1}$ by thermal radiation heater 20a is completed. However, other embodiments may perform soldering by reducing the pressure of the chamber interior before the start of heating or at the same time of the start of heating by thermal radiation heater 20a. In this case, the pressure-reducing operation and the heating operation can be performed concurrently, and thus the cycle time for soldering can be shortened.

The embodiment shown in FIG. 4B is configured to reduce the pressure of the chamber interior before the start of heating by thermal radiation heater. Heating is performed in a vacuum from the start of heating, and thus there is a divergence in temperature between the temperature $T_B$ of the placing carriage table and the temperature $T_D$ of the object from the start of heating. However, the heat transfer waiting time is not set and the pressure-reducing operation is not necessarily put on standby as described above, and thus the cycle time for soldering is shortened further. This embodiment is configured to perform the vacuum break B when the temperature $T_B$ of the placing carriage table agrees with the temperature $T_D$ of the object. The vacuum break B in this case is said to be performed within the range of the specified temperature difference $T_O$. In this case, the rise of the temperature $T_D$ of the object after the vacuum break B is reduced further, and the rise of the temperature $T_D$ of the object is substantially prevented. In other words, this configuration can perform the vacuum break B without rising in the temperature $T_D$ of the object.

The soldering apparatus 100 according to this embodiment is described as including one vacuum chamber 10 and being provided with thermal radiation heater 20a and the cooler 30 in the same vacuum chamber 10. However, the soldering apparatus in other embodiments may include a plurality of vacuum chambers and be provided with thermal radiation heater 20a and the cooler 30 in different vacuum chambers. In this case, the heating by thermal radiation heater 20a and the heat discharge (cooling) by the cooler 30 can be prevented from interfering with each other, and thus efficient heating and heat discharge (cooling) can be conducted.

The cooling block 30a according to this embodiment is described as being formed in comb shape. However, the cooling block 30a in another embodiment may be formed in various shapes that are formed in appropriate shape corresponding to the shape of thermal radiation heater 20a within a range where the cooling block is disposed adjacently to thermal radiation heater 20a and thus can efficiently cool the placing carriage table 5a.

This embodiment is described as soldering under a condition where the object 1 is placed on the placing carriage table 5a. However, other embodiments may further include a pushing member for pushing the object 1 placed on the placing carriage table 5a against the placing carriage table 5a by appropriate force. In this case, the object 1 is pushed against the placing carriage table 5a, and thus the contact state (and heat transfer) of both components can be in good condition further. Thus, the efficiency of soldering by the soldering apparatus is further improved, and the cycle time can be shortened.

The cooling block 30a according to this embodiment is described as being driven by the drive unit 30b so as to approach and move away from the placing carriage table 5a and cool. However, other embodiments may be configured such that the placing carriage table 5a where the object 1 is placed is driven to approach and move away from the cooling block 30a provided fixedly and cool. The placing carriage table 5a and the cooling block 30a may be provided to relatively approach and move away from each other.

This embodiment is described such that the comb tooth part of the cooling block 30a moves, when cooling the object 1, the placing carriage table 5a away from the thermal radiation heater 20a with a specified spacing and also reduces the heating efficiency of the placing carriage table 5a by thermal radiation heater 20a through the blockage of diffusion of heat radiation, resulting in the improvement of the cooling efficiency of the placing carriage table 5a and the object 1. However, other embodiments may be configured to control the temperature of the object 1 by adjusting drive amount of the cooling block 30a to change heat discharge efficiency (cooling efficiency) from the placing carriage table 5a. In this case, the temperature of the object 1 can be controlled through the change of the heat discharge efficiency (cooling efficiency) from the placing carriage table 5a as a buffer part.

This embodiment is described such that the heat capacity of the placing carriage table 5a provided as the buffer part is typically defined to be larger than that of the object 1. However, it may be sufficient if the buffer part can be interposed between the object 1 (specifically, electronic component 2) and thermal radiation heater 20a (or cooling block 30a) to thermally buffer the heating (or cooling) by thermal radiation heater 20a (or cooling block 30a). Thus, in other embodiments, the heat capacity of the placing carriage table 5a may be smaller than or equal to that of the object 1 within the range where the placing carriage table thermally buffers the heating (or cooling) by thermal radiation heater 20a (or cooling block 30a).

This embodiment is described such that heating by thermal radiation heater 20a is conducted through the heat radiation with the specified heat radiation output and the temperature of the object 1 is controlled through on/off adjustment. However, other embodiments may be configured such that heating by thermal radiation heater 20a is conducted through the adjustment of both the heat radiation output and energization/de-energization in combination and the PID control is performed in accordance with the temperature $T_D$ of the object 1 as is the case with the cooler 30. In this case, the temperature of the object 1 can adequately be controlled through heating adjustment by thermal radiation heater 20 and heat discharge adjustment (cooling adjustment) by the cooler 30 in combination.

This embodiment is described as performing the temperature control of the object 1 through the adjustment of heat discharge (cooling) by the cooling block 30a on the basis of the proportional-plus-integral-plus-derivative control (PID control). However, other embodiments may perform the temperature control by cooling on the basis of any of proportional control, proportional-plus-derivative control, or proportional-plus-integral control. In this case, the soldering apparatus 100 can be provided more easily.

This embodiment is described such that the soldering apparatus 100 includes the gas supply apparatus 70b as the vacuum breaker 70 in addition to the gate valve 70a. However, other embodiments may include only the gate valve 70a as the vacuum breaker 70 without the gas supply apparatus 70b. In this case, since the vacuum break B can be performed with the gate valve 70a, the soldering apparatus 100 can be provided more easily.

This embodiment describes the soldering apparatus 100 for soldering the object 1 in order to exemplify the heat-bonding apparatus according to the invention of the present application. However, heat-bonding performed by the heat-bonding apparatus according to the invention of the present application is not limited to soldering. The heat-bonding apparatus according to the present invention can perform a wide variety of heat-bonding for bonding the object (workpiece) by heating and cooling the bonding material. Thus, the heat-bonding apparatus such as the soldering apparatus 100 according to this embodiment may be configured to perform brazing with the metal bonding materials and bonding and welding with resin bonding materials or glass bonding materials.

Examples of brazing with the metal bonding materials include so called the soldering with soft solder that is an alloy of lead, tin, antimony, cadmium, or zinc, for example, and brazing with hard solder that is an alloy of silver, brass, aluminum alloy, phosphorus copper, nickel, or gold, for example. Examples of heat-bonding with the resin bonding materials include the heat-bonding with thermoplastic resins having conductivity or insulation properties. The resin bonding material may be the one which solidifies by being heated to the specified temperature as is the case with thermosetting resin. In addition, the glass bonding materials such as low-melting glass formulated with electrically-conducting materials may be used. Any of the heat-bonding may be required to be performed in a vacuum in order to avoid the formation of the oxide film that blocks the bonding.

Figure 5A:
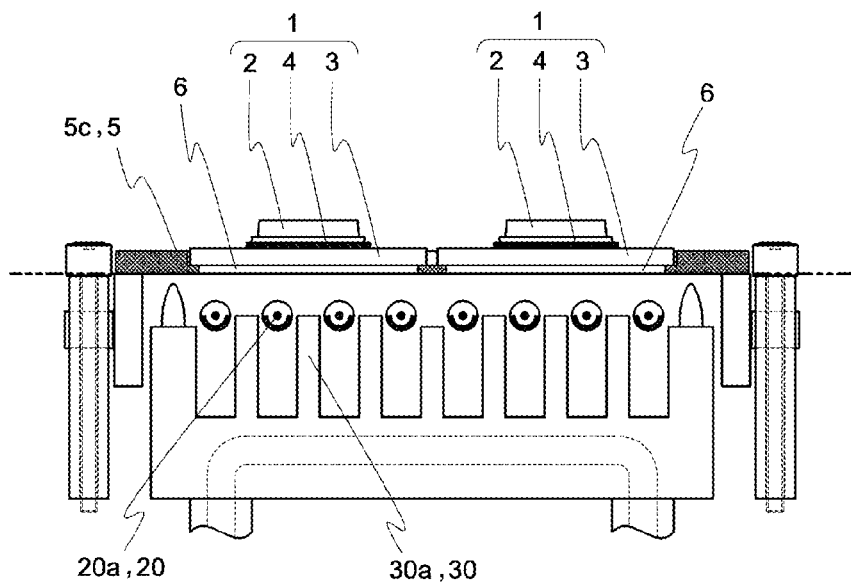
FIG. 5A is a front cross-sectional view showing an example of a soldering apparatus as the heat-bonding apparatus according to a second embodiment of the present invention, which shows a state where the cooling block is spaced apart from the buffer part and the buffer part is heated with thermal radiation heater.
Figure 5B:
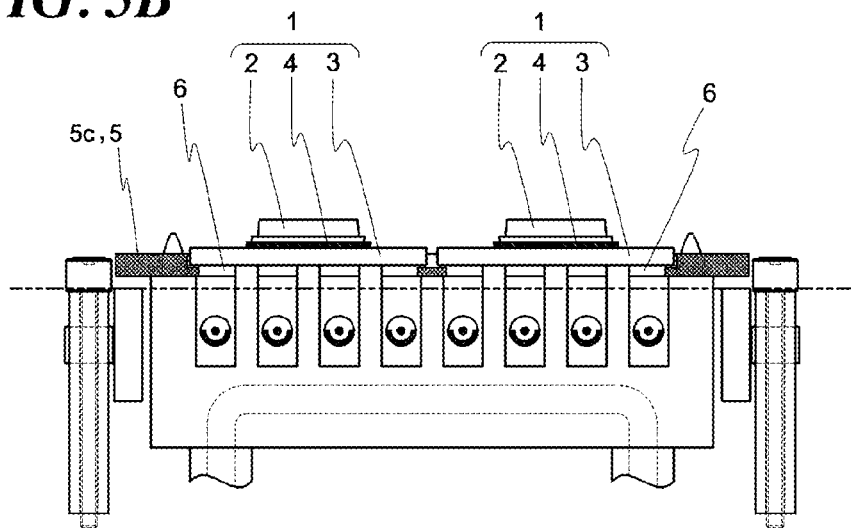
FIG. 5B is a front cross-sectional view showing the second embodiment of the present invention, which shows a state where the cooling block is brought into contact with the buffer part and the heat of the buffer part is discharged with the cooling block.

Referring to FIG. 5, a soldering apparatus as the heat-bonding apparatus according to a second embodiment of the present invention is described. The soldering apparatus according to this embodiment differs from the soldering apparatus 100 according to the first embodiment only in a part of structure of the placing carriage table 5c where the object 1 is placed and the cooling block 30a. Thus, FIG. 5 illustrating the soldering apparatus according to this embodiment only shows an enlarged view of the different part from the soldering apparatus 100 described above with other parts omitted for easily understanding. FIG. 5A is a view showing a heating state of the soldering apparatus and corresponding to FIG. 1A. FIG. 5B is a view showing a heat discharging state (cooling state) and corresponding to FIG. 1B.

The placing carriage table 5c included in the soldering apparatus according to this embodiment is described. The different point of the placing carriage table 5c from the placing carriage table 5a (see FIG. 1) of the soldering apparatus 100 described above is that the opening windows (holes) 6 are formed in the placing carriage table 5c. Thus, the soldering apparatus according to this embodiment is configured such that thermal radiation heater 20a applies heat to the substrate 3 through the opening windows 6. A part of the cooling plate of the cooling block 30a is provided so as to make contact with the substrate 3 to discharge heat of the substrate 3. The buffer temperature sensor 60 (see FIG. 1A) is provided so as to detect the temperature $T_B$ of the substrate 3 (see FIG. 4A) as the buffer part.

In this embodiment, the substrate 3 (and the solder joint part 4) functions as the buffer part for the electronic component 2. The substrate 3 (and the solder joint part 4) interposes between the heat-sensitive and thermally deformable electronic component 2 and thermal radiation heater 20a and prevents the overheating of the electronic component 2. The cooling block 30a approaches and moves away from the substrate 3 and adjusts the heat discharge (cooling) from the substrate 3. The substrate 3 prevents thermal deformation of the electronic component 2 and achieves efficient soldering by thermally equalizing the heating and the cooling with thermal radiation heater 20a and the cooling block 30a in terms of space and time and transferring heat to the electronic component 2. The heat capacity of the substrate 3 is smaller than that of the placing carriage table 5a (see FIG. 1) described above but large enough in comparison with the electronic component 2.

As described above, the electronic component 2 that is the object 1 to be soldered in this embodiment is placed on the substrate 3 (and the solder joint part 4) as the buffer part and located on the downstream side of heat transfer through the contact face between the substrate 3 and the electronic component 2 to be soldered. In this case, the object 1 can be prevented from being overheated in a similar manner to the soldering apparatus 100 described above, and the object 1 can be heated to the control target temperature $T_{T2}$ (see FIG. 4A) without fail and efficiently soldered in short cycle time.

Figure 6:
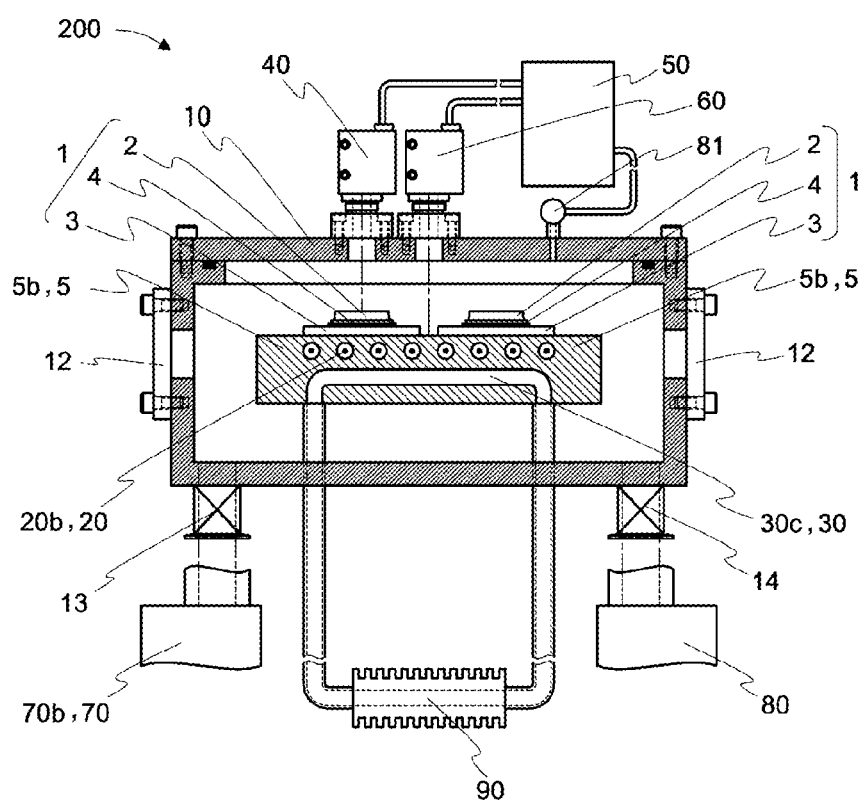
FIG. 6 is a front cross-sectional view showing an example of a soldering apparatus as the heat-bonding apparatus according to a third embodiment of the present invention.

Referring to FIG. 6, a soldering apparatus 200 as the heat-bonding apparatus according to a third embodiment of the present invention is described. The structure of a heat treatment mechanism in the soldering apparatus 200 differs from the soldering apparatus 100 described above only in the structure of a fixed placing table 5b (placing table 5) where the object 1 is placed. Thus, only the structure of the fixed placing table 5b is described for the soldering apparatus 200. The different point of the fixed placing table 5b from the placing carriage table 5a (see FIG. 1) of the soldering apparatus 100 described above is that the fixed placing table 5b is fixed to the other main components in the soldering apparatus 200. The fixed placing table 5b includes an electrothermal heater 20b as the heater 20 and a coolant circulating circuit 30c as the cooler 30 in its inside.

The fixed placing carriage table 5b is made of copper that has a high thermal conductivity. Thus, the object 1 heat-treated can efficiently be heated or cooled through the fixed placing carriage table 5b. The electrothermal heater 20b is provided as a sheathed heater. In this embodiment, the fixed placing table 5b interposing between the object 1 and the electrothermal heater 20b and the coolant circulating circuit 30c functions as the buffer part. The fixed placing carriage table 5b is not moved (driven) unlike the case with the placing carriage table 5a and the cooling block 30a (see FIG. 1) of the soldering apparatus 100 described above. Thus, the fixed placing table 5b is not provided with driving mechanisms such as the drive unit (air cylinder) 30b and the guide post 15 (see FIG. 1A) that are included in the aforementioned soldering apparatus 100 described above. Thus, the soldering apparatus 200 can be provided more easily than the aforementioned soldering apparatus 100.

The coolant circulating circuit 30c according to this embodiment can remove, through direct heat-discharging (cooling), the residual heat released by the electrothermal heater 20b after finishing the electrical heating. Thus, the soldering apparatus 200 can control the temperature of the object 1 more efficiently than the aforementioned soldering apparatus 100. The adjustment of heat discharge (cooling) from the fixed placing table 5b with the coolant circulating circuit 30c can be performed by adjusting, with the coolant supplying unit 90, the flow rate of the coolant circulating in the coolant circulating circuit 30c. Specifically, the controller 50 can control the temperature $T_D$ of the object 1 by adjusting the flow rate of the cooling water circulating in the coolant circulating circuit 30c in accordance with the temperature $T_D$ of the object 1 (see FIG. 4A) detected by the object temperature sensor 40. The adjustment of heat discharge (cooling) can also be performed in the aforementioned soldering apparatus 100. In the case of using the soldering apparatus 200 according to this embodiment, the object 1 can be prevented from being overheated in a similar manner to the soldering apparatus 100 described above, and the object 1 can be heated to the target temperature $T_{T2}$ (see FIG. 4A) without fail and efficiently soldered in short cycle time.

Figure 7:
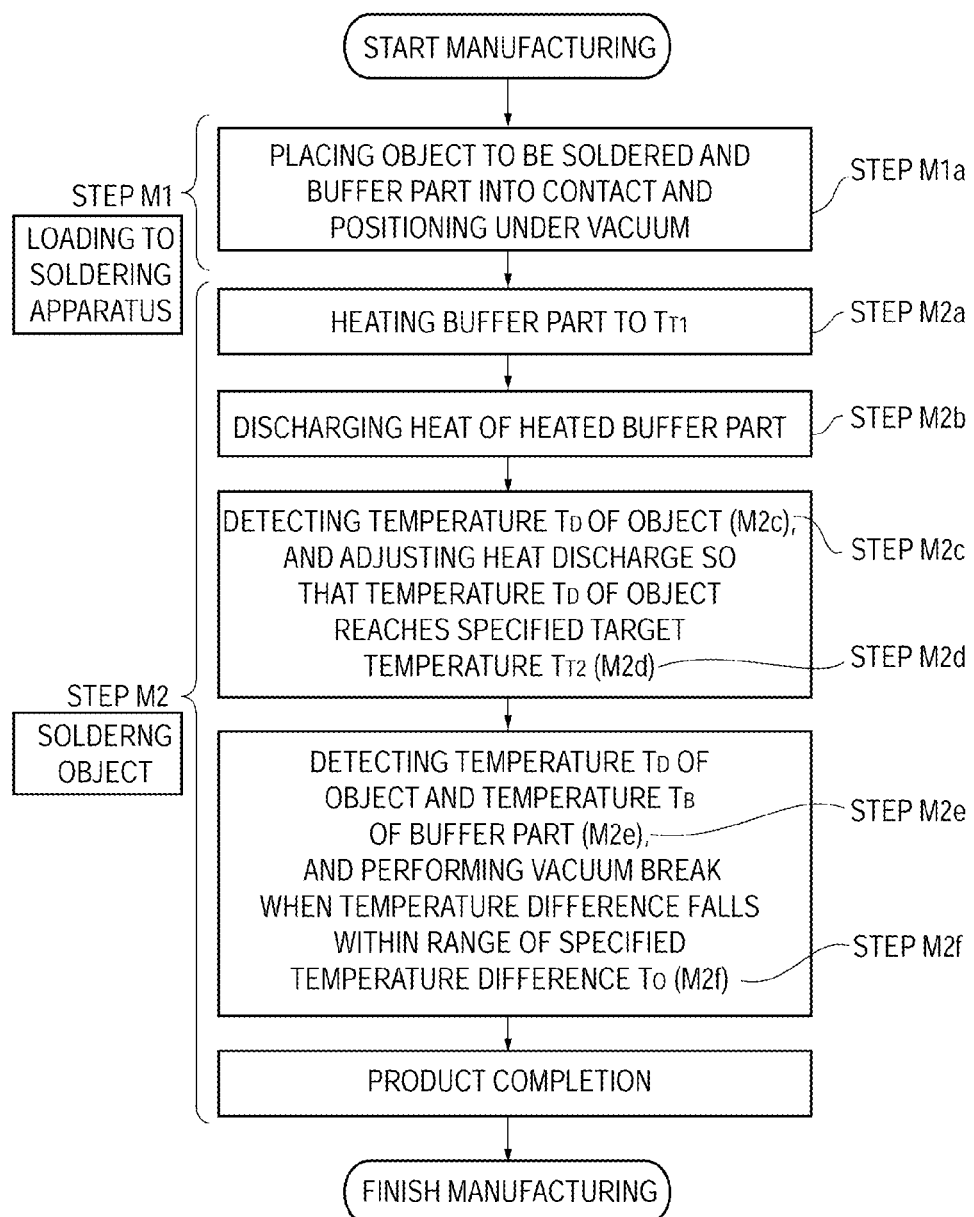
FIG. 7 is a flowchart showing an example of a method of manufacturing a soldered product as a heat-bonded product according to a fourth embodiment of the present invention.

Referring to a flowchart in FIG. 7, a method of manufacturing a soldered product as a heat-bonded product according to a fourth embodiment of the present invention is described. In the method of manufacturing the soldered product according to this embodiment, the object 1 to be soldered (see FIG. 1 and FIG. 6) and the buffer part 5 (see FIG. 1A and FIG. 6) are placed into contact with each other and loaded into the soldering apparatus (see FIG. 1A and FIG. 6) (Step M1). The soldering apparatus is used to solder the object 1 (Step M2).

In the Step M1 of loading, the object 1 to be soldered (see FIG. 1A and FIG. 6) and the buffer part 5 (see FIG. 1 and FIG. 6) are placed into contact with each other and positioned under vacuum inside the chamber (Step M1a).

In the Step M2 of soldering, the buffer part 5 (see FIG. 1A and FIG. 6) is heated to the specified first control target temperature $T_{T1}$ (see FIG. 4A) (Step M2a). Then, the heat of the heated buffer part 5 is discharged (Step M2b). The temperature $T_D$ (see FIG. 4A) of the object heated through the buffer part 5 is then detected (Step M2c), and the heat discharge from the buffer part 5 is adjusted so that the temperature $T_D$ of the object reaches the specified second control target temperature $T_{T2}$ (see FIG. 4A) (Step M2d).

Then, the temperature $T_D$ (see FIG. 4A) of the object and the temperature $T_B$ (see FIG. 4A) of the buffer part 5 (see FIG. 1A and FIG. 6) are detected (Step M2e), and the vacuum break B (see FIG. 4A) is performed when the temperature difference between the temperature $T_D$ of the object and the temperature $T_B$ of the buffer part 5 falls within the range of the specified temperature differences $T_O$ (see FIG. 4A) (Step M2f). The method of manufacturing the soldered product may further include any of the control steps described in the above embodiments in addition to the steps described above. For example, the temperature difference between the buffer part and the object is controlled by the adjustment of the pressure in a vacuum so that the temperature difference may be smaller than $T_O$.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS

1: object (workpiece)
2: electronic component
3: substrate
4: solder joint part
5: placing table (buffer part)
5a: placing carriage table
5b: fixed placing table
5c: placing carriage table with opening windows
6: opening window
10: vacuum chamber
11: conveying roller
12: view window
13: inlet port
14: exhaust port
15: guide post
16: external conveying roller
20: heater
20a: thermal radiation heater
20b: electrothermal heater
30: cooler
30a: cooling block
30b: drive unit (air cylinder)
30c: coolant circulating circuit
31: positioning pin
40: object temperature sensor (radiation thermometer)
50: controller
51: central processing unit
52: heater operating part
53: cooler operating part
54: object temperature sensor operating part
55: control part
55a: set value memory unit
55b: pressure-reducing operation part
55c: object temperature control part
55d: vacuum breaking operation part
56: buffer temperature sensor operating part
57: vacuum breaker operating part
58: vacuum pump operating part
59: coolant supplying unit operating part
60: buffer temperature sensor (radiation thermometer)
70: vacuum breaker
70a: gate valve
70b: gas supply apparatus
80: vacuum pump (air displacement pump)
81: pressure gage
90: coolant supplying unit
100: soldering apparatus (heat-bonding apparatus)
200: soldering apparatus (heat-bonding apparatus)

The invention claimed is:

1. A heat-bonding apparatus comprising:
a vacuum chamber for housing an object to be heat-bonded and a buffer part;
a heater for applying heat to the buffer part placed into contact with the object housed in the vacuum chamber;
an object temperature sensor for detecting a temperature of the object heated through the buffer part;
a buffer temperature sensor for detecting a temperature of the buffer part;
a vacuum breaker for breaking a vacuum in the vacuum chamber; and
a controller for operating the vacuum breaker to break the vacuum in the vacuum chamber when a temperature difference between a first detected temperature of the object temperature sensor and a second detected temperature of the buffer temperature sensor falls within a range of specified temperature difference.

2. The heat-bonding apparatus of claim 1,
wherein the controller is configured to lower the temperature of the object below a melting point of a bonding material after breaking the vacuum in the vacuum chamber.

3. The heat-bonding apparatus of claim 1, further comprising:
a vacuum pump for discharging air inside the vacuum chamber,
wherein the controller is configured to control so that the object is prevented from being overheated through adjustment of heat transfer from the buffer part to the object by adjusting air discharge with the vacuum pump and vacuum break with the vacuum breaker in combination.

4. The heat-bonding apparatus of claim 1, further comprising:
a vacuum pump for discharging air inside the vacuum chamber,
wherein the controller is configured to control the temperature difference between the first detected temperature and the second detected temperature to fall within the range of specified temperature difference through adjustment of heat transfer from the buffer part to the object by adjusting air discharge with the vacuum pump and vacuum break with the vacuum breaker in combination.

5. The heat-bonding apparatus of claim 1,
wherein the buffer part is provided as a placing table for placing the object thereon, and the heater is provided inside the placing table.

6. A method of manufacturing a heat-bonded product, comprising the steps of:
providing the heat-bonding apparatus of claim 1;
placing to load the object to be heat-bonded in contact with the buffer part into the heat-bonding apparatus; and
heat-bonding the object using the heat-bonding apparatus.

7. A method of manufacturing a heat-bonded product, comprising the steps of:
placing an object to be heat-bonded and a buffer part under vacuum, the object being arranged into contact with the buffer part;
heating the buffer part under vacuum;
detecting a first temperature of the object heated through the buffer part;
detecting a second temperature of the buffer part;
breaking the vacuum when a temperature difference between the first temperature detected by the first temperature detecting step and the second temperature detected by the second temperature detecting step falls within a range of specified temperature difference.

* * * * *